United States Patent
Takahashi

(10) Patent No.: US 7,236,025 B2
(45) Date of Patent: Jun. 26, 2007

(54) PLL CIRCUIT AND PROGRAM FOR SAME

(75) Inventor: Hiroki Takahashi, Tokyo (JP)

(73) Assignee: Elpida Memory, Inc., Tokyo (JP)

( * ) Notice: Subject to any disclaimer, the term of this patent is extended or adjusted under 35 U.S.C. 154(b) by 0 days.

(21) Appl. No.: 11/340,633

(22) Filed: Jan. 27, 2006

(65) Prior Publication Data

US 2006/0170468 A1    Aug. 3, 2006

(30) Foreign Application Priority Data

Jan. 28, 2005    (JP)    ............................. 2005-021664

(51) Int. Cl.
*H03L 7/06* (2006.01)
(52) U.S. Cl. ..................... 327/147; 327/156
(58) Field of Classification Search ........ 327/147–150, 327/156–159, 162, 163; 331/17, 25; 375/373–376
See application file for complete search history.

(56) References Cited

U.S. PATENT DOCUMENTS

| | | | |
|---|---|---|---|
| 5,438,299 A | 8/1995 | Shimada et al. | 337/17 |
| 6,107,862 A | 8/2000 | Mukainakano et al. | 327/536 |
| 6,111,468 A | 8/2000 | Tanishima | 331/17 |
| 6,771,114 B2 | 8/2004 | Watarai | 327/536 |
| 6,829,318 B2 * | 12/2004 | Kawahara | 375/376 |

FOREIGN PATENT DOCUMENTS

| | | |
|---|---|---|
| JP | 06-291649 | 10/1994 |
| JP | 10-248240 | 9/1998 |
| JP | 11-103251 | 4/1999 |
| JP | 11-225069 | 8/1999 |
| JP | 2003-087115 | 3/2003 |

* cited by examiner

*Primary Examiner*—Linh My Nguyen
(74) *Attorney, Agent, or Firm*—Foley & Lardner LLP

(57) ABSTRACT

A reference voltage signal (VpmpR), which is obtained by applying the output signal UPB/UP of a phase/frequency detection circuit (PFD) as a constantly locked state signal to a replica charge pump circuit (CPR) and then integrating, is compared in a correction voltage generation circuit (CMP) with a PLL circuit control voltage signal (Vpmp) for controlling a voltage-controlled oscillation circuit (VCO) by a desired voltage, this PLL circuit-controlled voltage signal being obtained by applying the output signal UPB/DN of the phase/frequency detection circuit as input to a charge pump circuit (CP) and then integrating, and the correction voltage signal (Vcmp) that is the result of the comparison then controls a charge pump bias circuit (CPBias) that controls the bias currents of the charge pump circuit and replica charge pump circuit.

6 Claims, 15 Drawing Sheets

1.0 PLL circuit of the first embodiment of the present invention

An operational timing chart of the PLL circuit when locked

PLL CIRCUIT AND PROGRAM FOR SAME

BACKGROUND OF THE INVENTION

1. Field of the Invention

The present invention relates to a PLL circuit and to a program for the PLL circuit.

2. Description of the Related Art

In a charge pump-type PLL circuit of the prior art, the output impedance value or fluctuation of output impedance value of PMOS and NMOS, which are the circuit elements that make up a charge pump circuit, generates differences between the charging current (hereinbelow abbreviated as "Isrc") and the discharging current (hereinbelow abbreviated as "Isnk"), which should be the same values. A charge pump circuit of the prior art is therefore unable to maintain the output voltage within a desired range, and the output voltage may in some cases deviate from the locked voltage range. This is a flaw that degrades the performance of the PLL circuit.

The phase error that results from the charging current-discharging current error (Isrc-Isnk error) of a charge pump-type PLL circuit has been identified as a problem in the prior art, and various solutions have been proposed as a correction means, one example being the charge pump-type current correction circuit (CP circuit) of FIG. 1 described in JP-A-2003-87115 (hereinbelow referred to as "Patent Document 1").

When using the UP pulse and DN pulse of a phase comparator to control the output voltage for charging and discharging the capacitance of LPF, the CP circuit of FIG. 1 of Patent Document 1 extracts the difference between the charging current and discharging current that is produced by divergence in the output impedance of PMOS and NMOS and corrects by means of a sense amplifier to eliminate the difference between the two currents. The output of this sense amplifier is fed back to the PMOS, whereby the output voltage is fixed or a prescribed voltage range is realized.

A PLL circuit of the prior art has a number of problems, the first problem being the existence of phase error in the PLL circuit. This problem occurs due to the occurrence of the Isrc-Isnk error of the charge pump circuit.

The second problem is the dependency of phase error upon processing, temperature, and the power supply voltage. This problem occurs because the Isrc-Isnk error of the charge pump circuit is dependent upon the charge pump input waveform, the process, the temperature, and the power supply voltage.

The CP circuit of FIG. 1 of Patent Document 1 is not directed to providing a solution for the Isrc-Isnk error that is free of dependency on the power supply voltage, the temperature, and the input waveform of the UP/DN signals that are applied as input to the charge pump circuit.

SUMMARY OF THE INVENTION

It is an object of the present invention to provide a PLL circuit having a means for correcting Isrc-Isnk error that includes input waveform of the UP/DN signals that are applied as input to the charge pump circuit and that can thus realize greater accuracy, and to provide a program for such a PLL circuit.

According to the PLL circuit of the present invention, in a PLL circuit that is provided with:

a phase/frequency detection circuit for detecting the phase difference and frequency difference between a reference clock that is received as input from the outside and a clock that is generated by the PLL circuit, and for generating and supplying as output a phase/frequency amplification signal and a phase/frequency attenuation signal having pulse widths that accord with the phase difference and frequency difference as well as complementary signals of these signals;

a charge pump bias circuit for receiving a reference bias voltage as input and generating and supplying as output a first charging current bias voltage and a first discharging current bias voltage;

a charge pump circuit for supplying charging current in accordance with the first charging current bias voltage, supplying discharging current in accordance with the first discharging current bias voltage, and generating and supplying as output a PLL control voltage;

a voltage-controlled oscillation circuit for receiving the PLL control voltage and generating a clock; and a frequency-dividing circuit for dividing the clock that is supplied as output by the voltage-controlled oscillation circuit to generate a feedback clock and supplying the feedback clock as output to the phase/frequency detection circuit;

wherein:

the PLL circuit is further provided with a correction voltage generation circuit for generating and supplying as output a correction voltage for correcting the PLL control voltage;

the charge pump bias circuit receives the correction voltage that is supplied as output by the correction voltage generation circuit to regulate the discharging current and generate and supply as output a second discharging current bias voltage;

the PLL circuit is further provided with:

a first capacitor that is provided between the charge pump circuit and the voltage-controlled oscillation circuit; and a replica charge pump circuit that is provided with a second capacitor in which charging/discharging is carried out in accordance with output, the replica charge pump circuit supplying charging current to the second capacitor during the time interval in which both the first charging current bias voltage is received as input and the complementary signal of the phase/frequency amplification signal is low level, and during the time interval in which both the second discharging current bias voltage is received as input and the phase/frequency amplification signal is high level, supplying discharging current to the second capacitor, generating a reference voltage in which these currents are combined, and supplying this reference voltage as output to the correction voltage generation circuit;

the charge pump circuit:

supplies charging current to the first capacitor during the time interval in which both the first charging current bias voltage is received as input and the complementary signal of the phase/frequency amplification signal is low level; and during the time interval in which both the second discharging current bias voltage is received as input and the phase/frequency attenuation signal is high level, supplies discharging current to the first capacitor, generates a PLL control voltage in which these currents are combined, and supplies this PLL control voltage as output to the voltage-controlled oscillation circuit and correction voltage generation circuit; and the correction voltage generation circuit:

compares the PLL control voltage and the reference voltage, generates a differential voltage as a correction voltage, and supplies the correction voltage as output to the charge pump bias circuit.

According to the PLL circuit of the present invention, in a PLL circuit that is provided with:

a phase/frequency detection circuit for detecting the phase difference and frequency difference between a reference clock that is received as input from the outside and a clock that is generated by the PLL circuit, and for generating and supplying as output a phase/frequency amplification signal and a phase/frequency attenuation signal having pulse widths that accord with the phase difference and frequency difference as well as complementary signals of these signals;

a charge pump bias circuit for receiving a reference bias voltage as input and generating and supplying as output a first charging current bias voltage and a first discharging current bias voltage;

a charge pump circuit for supplying charging current in accordance with the first charging current bias voltage, supplying discharging current in accordance with the first discharging current bias voltage, and generating and supplying as output a PLL control voltage;

a voltage-controlled oscillation circuit for receiving the PLL control voltage and generating a clock; and a frequency-dividing circuit for dividing the clock that is supplied as output by the voltage-controlled oscillation circuit to generate a feedback clock and supplying the feedback clock to the phase/frequency detection circuit;

wherein the PLL circuit is further provided with a correction voltage generation circuit for generating and supplying as output a correction voltage for correcting the PLL control voltage;

the charge pump bias circuit receives the correction voltage that is supplied as output by the correction voltage generation circuit to regulate the charging current and generate and supply as output a second charging current bias voltage;

the PLL circuit is provided with a first capacitor that is provided between the charge pump circuit and the voltage-controlled oscillation circuit and a second capacitor in which charging/discharging is carried out in accordance with output;

the PLL circuit is further provided with a replica charge pump circuit for supplying charging current to the second capacitor during the time interval in which both the second charging current bias voltage is received as input and the complementary signal of the phase/frequency amplification signal is low level, and during the time interval in which both the first discharging current bias voltage is received as input and the phase/frequency amplification signal is high level, supplying discharging current to the second capacitor, generating a reference voltage in which these currents are combined, and supplying this reference voltage as output to the correction voltage generation circuit;

the charge pump circuit: supplies charging current to the first capacitor during the time interval in which both the second charging current bias voltage is received as input and the complementary signal of the phase/frequency amplification signal is low level, and during the time interval in which both the first discharging current bias voltage is received as input and the phase/frequency attenuation signal is high level, supplies discharging current to the first capacitor, generates a PLL control voltage in which these currents are combined, and supplies this PLL control voltage to the voltage-controlled oscillation circuit and correction voltage generation circuit; and the correction voltage generation circuit compares the PLL control voltage and the reference voltage, generates a differential voltage as the correction voltage, and supplies the correction voltage as output to the charge pump bias circuit.

According to the PLL circuit of the present invention, in a PLL circuit that is provided with:

a phase/frequency detection circuit for detecting the phase difference and frequency difference between a reference clock that is received as input from the outside and a clock that is generated by the PLL circuit, and for generating and supplying as output a phase/frequency amplification signal and a phase/frequency attenuation signal having pulse widths that accord with the phase difference and frequency difference as well as complementary signals of these signals;

a charge pump bias circuit for receiving a reference bias voltage as input and generating and supplying as output a first charging current bias voltage and a first discharging current bias voltage;

a charge pump circuit for supplying charging current in accordance with the first charging current bias voltage, supplying discharging current in accordance with the first discharging current bias voltage, and generating and supplying as output a PLL control voltage;

a voltage-controlled oscillation circuit for receiving the PLL control voltage as input and generating a clock; and a frequency-dividing circuit for dividing the clock that is supplied as output by the voltage-controlled oscillation circuit to generate a feedback clock and supplying the feedback clock as output to the phase/frequency detection circuit;

the PLL circuit is further provided with: a correction voltage generation circuit for generating and supplying as output a correction voltage for correcting the PLL control voltage;

the charge pump bias circuit receives the correction voltage that is supplied as output by the correction voltage generation circuit to regulate the charging current and generate and supply as output a second charging current bias voltage; and receives as input the correction voltage that is the complement of the correction voltage that is supplied as output by the correction voltage generation circuit to regulate the discharging current and generate and supply as output a second discharging current bias voltage;

the PLL circuit is provided with a first capacitor that is provided between the charge pump circuit and the voltage-controlled oscillation circuit and a second capacitor in which charging/discharging is carried out in accordance with output;

the PLL circuit is further provided with a replica charge pump circuit for supplying charging current to the second capacitor during the time interval in which both the second charging current bias voltage is received as input and the complementary signal of the phase/frequency amplification signal is low level, and during the time interval in which both the second discharging current bias voltage is received as input and the phase/frequency amplification signal is high level, supplying discharging current to the second capacitor, generating a reference voltage in which these currents are combined, and supplying this reference voltage as output to the correction voltage generation circuit;

the charge pump circuit: supplies charging current to the first capacitor during the time interval in which both the second charging current bias voltage is received as input and the complementary signal of the phase/frequency amplification signal is low level; and during the time interval in which both the second discharging current bias voltage is received as input and the phase/frequency attenuation signal is high level, supplies discharging current to the first capacitor, generates a PLL control voltage in which these currents are combined, and supplies this PLL control voltage as output to the voltage-controlled oscillation circuit and correction voltage generation circuit; and the correction voltage generation circuit compares the PLL control voltage and the reference voltage, generates the differential voltage as the correction voltage, and supplies the correction voltage and a correction voltage that is the complement of this voltage as output to the charge pump bias circuit.

According to the PLL circuit of the present invention, in a PLL circuit that is provided with:

a phase/frequency detection circuit for detecting the phase difference and frequency difference between a reference clock that is received as input from the outside and a clock that is generated by the PLL circuit, and for generating and supplying as output a phase/frequency amplification signal and a phase/frequency attenuation signal having pulse widths that accord with the phase difference and frequency difference as well as complementary signals of these signals;

a charge pump bias circuit for receiving a reference bias voltage as input and generating and supplying as output a first charging current bias voltage and a first discharging current bias voltage;

a charge pump circuit for supplying charging current in accordance with the first charging current bias voltage, supplying discharging current in accordance with the first discharging current bias voltage, and generating and supplying as output a PLL control voltage;

a voltage-controlled oscillation circuit for receiving the PLL control voltage and generating a clock; and a frequency-dividing circuit for dividing the clock that is supplied as output by the voltage-controlled oscillation circuit to generate a feedback clock and supplying the feedback clock as output to the phase/frequency detection circuit;

wherein:

the PLL circuit is further provided with:

a correction voltage generation circuit for generating and supplying as output a correction voltage for correcting the PLL control voltage;

a first capacitor that is provided between the charge pump circuit and the voltage-controlled oscillation circuit; and a replica charge pump circuit that is provided with a second capacitor in which charging/discharging is carried out in accordance with output, said replica charge pump circuit, during the time interval in which both the first charging current bias voltage is received as input and the complementary signal of the phase/frequency amplification signal is low level, supplying charging current to the second capacitor, receiving the correction voltage that is supplied as output by the correction voltage generation circuit to regulate the discharging current and generate a second discharging current bias voltage; and during the time interval in which both the second discharging current bias voltage is generated and the phase/frequency amplification signal is high level, supplying discharging current to the second capacitor, generating a reference voltage in which these currents are combined, and supplying this reference voltage to the correction voltage generation circuit;

the charge pump circuit: during the time interval in which both the first charging current bias voltage is received as input and the complementary signal of the phase/frequency amplification signal is low level, supplies charging current to the first capacitor, receives the correction voltage that is supplied as output by the correction voltage generation circuit to regulate the discharging current and generate the second discharging current bias voltage; and during the time interval in which both the second discharging current bias voltage is generated and the phase/frequency attenuation signal is high level, supplies discharging current to the first capacitor, generates a PLL control voltage in which these currents are combined, and supplies this PLL control voltage as output to the voltage-controlled oscillation circuit and correction voltage generation circuit; and the correction voltage generation circuit compares the PLL control voltage and the reference voltage, generates a differential voltage as the correction voltage, and supplies the correction voltage as output to the charge pump circuit and the replica charge pump circuit.

According to the PLL circuit of the present invention, in a PLL circuit that is provided with:

a phase/frequency detection circuit for detecting phase difference and frequency difference between a reference clock that is received as input from the outside and a clock that is generated by the PLL circuit, and for generating and supplying as output a phase/frequency amplification signal and a phase/frequency attenuation signal having pulse widths that accord with the phase difference and frequency difference as well as complementary signals of these signals;

a charge pump bias circuit for receiving a reference bias voltage as input and generating and supplying as output a first charging current bias voltage and a first discharging current bias voltage;

a charge pump circuit for supplying charging current in accordance with the first charging current bias voltage, supplying discharging current in accordance with the first discharging current bias voltage, and generating and supplying as output a PLL control voltage;

a voltage-controlled oscillation circuit for receiving the PLL control voltage and generating a clock; and a frequency-dividing circuit for dividing the clock that is supplied as output by the voltage-controlled oscillation circuit to generate a feedback clock and supplying the feedback clock as output to the phase/frequency detection circuit;

wherein:

the PLL circuit is further provided with:

a correction voltage generation circuit for generating and supplying as output a correction voltage for correcting the PLL control voltage;

a first capacitor that is provided between the charge pump circuit and the voltage-controlled oscillation circuit; and a replica charge pump circuit that is provided with a second capacitor in which charging/discharging is carried out in accordance with output, the replica charge pump circuit receiving the correction voltage that is supplied as output by the correction voltage generation circuit to regulate the charging current and generate a second charging current bias voltage; during the time interval in which both the second charging current bias voltage is generated and the complementary signal of the phase/frequency amplification signal is low level, supplying charging current to the second capacitor; and during the time interval in which both the first discharging current bias voltage is received as input and the phase/frequency amplification signal is high level, supplying discharging current to the second capacitor, generating a reference voltage in which these currents are combined, and supplying this reference voltage to the correction voltage generation circuit;

the charge pump circuit: receives the correction voltage that is supplied as output by the correction voltage generation circuit to regulate the charging current and generate a second charging current bias voltage; during the time interval in which both the second charging current bias voltage is generated and the complementary signal of the phase/frequency amplification signal is low level, supplies charging current to the first capacitor; and during the time interval in which both the first discharging current bias voltage is received as input and the phase/frequency attenuation signal is high level, supplies discharging current to the first capacitor, generates a PLL control voltage in which these currents are combined, and supplies this PLL control voltage as output to the voltage-controlled oscillation circuit and correction voltage generation circuit; and the correction voltage generation circuit compares the PLL control voltage and the reference voltage, generates the differential voltage as the correction voltage, and supplies the correction voltage as output to the charge pump circuit and the replica charge pump circuit.

According to the PLL circuit of the present invention, in a PLL circuit that is provided with:

a phase/frequency detection circuit for detecting the phase difference and frequency difference between a reference clock that is received as input from the outside and a clock that is generated by the PLL circuit, and for generating and supplying as output a phase/frequency amplification signal and a phase/frequency attenuation signal having pulse widths that accord with the phase difference and frequency difference as well as complementary signals of these signals;

a charge pump bias circuit for receiving a reference bias voltage as input and generating and supplying as output a first charging current bias voltage and a first discharging current bias voltage;

a charge pump circuit for supplying charging current in accordance with the first charging current bias voltage, supplying discharging current in accordance with the first discharging current bias voltage, and generating and supplying as output a PLL control voltage;

a voltage-controlled oscillation circuit for receiving the PLL control voltage and generating a clock; and a frequency-dividing circuit for dividing the clock that is supplied as output by the voltage-controlled oscillation circuit to generate a feedback clock and supplying the feedback clock as output to the phase/frequency detection circuit;

wherein:

the PLL circuit is further provided with:

a correction voltage generation circuit for generating and supplying as output a correction voltage for correcting the PLL control voltage;

a first capacitor that is provided between the charge pump circuit and the voltage-controlled oscillation circuit; and a replica charge pump circuit that is provided with a second capacitor in which charging/discharging is carried out in accordance with output, the replica charge pump circuit receiving the correction voltage that is supplied as output by the correction voltage generation circuit to regulate the discharging current and generate a second discharging current bias voltage; during the time interval in which both the second discharging current bias voltage is generated and the phase/frequency amplification signal is high level, supplying discharging current to the second capacitor; and during the time interval in which both a correction voltage that is the complement of the correction voltage that is supplied as output by the correction voltage generation circuit is received as input to regulate the charging current and generate a second charging current bias voltage and the complementary signal of the phase/frequency amplification signal is low level, supplies charging current to the second capacitor, generates a reference voltage in which these currents are combined, and supplying this reference voltage as output to the correction voltage generation circuit;

the charge pump circuit: receives the correction voltage that is supplied as output by the correction voltage generation circuit to regulate the discharging current and generate a second discharging current bias voltage; during the time interval in which both the second discharging current bias voltage is generated and the phase/frequency attenuation signal is high level, supplies discharging current to the first capacitor; and during the time interval in which both a correction voltage that is the complement of the correction voltage that is supplied as output by the correction voltage generation circuit is received as input to regulate the charging current and generate a second charging current bias voltage and the complementary signal of the phase/frequency amplification signal is low level, supplies charging current to the first capacitor, generates a PLL control voltage in which these currents are combined, and supplies this PLL control voltage as output to the voltage-controlled oscillation circuit and correction voltage generation circuit; and the correction voltage generation circuit compares the PLL control voltage and the reference voltage, generates the differential voltage as the correction voltage, and supplies the correction voltage and the correction voltage that is the complement of this correction voltage to the charge pump circuit and the replica charge pump circuit.

The program of the present invention causes a microprocessor to function as the above-described PLL circuit.

The PLL circuit of the present invention is provided with: a means for always generating a reference voltage of the time in which Isrc and Isnk are equal regardless of the input waveform, processing, temperature, power supply voltage; means for generating voltage that accords with the difference between the PLL circuit control voltage and the reference voltage; and means for using a voltage that accords with this difference to correct the Isrc and Isnk of the charge pump circuit such that Isrc and Isnk are equal; and the PLL circuit therefore has the capability of maintaining Isrc and Isnk equal to each other in the charge pump circuit that determines the PLL circuit control voltage.

In the PLL circuit of the present invention, a reference voltage signal, which is obtained by applying the output signal UPB/UP of a phase/frequency detection circuit as a constantly locked state signal to a replica charge pump circuit and then integrating, and a PLL circuit control voltage, which is obtained by applying the output signal UPB/DN of the phase/frequency detection circuit as input to a charge pump circuit for controlling a voltage-controlled oscillation circuit by a desired voltage and then integrating, are compared in a correction voltage generation circuit; and then, by using the correction voltage signal that is the result of comparison to control the charge pump bias circuit that in turn controls the bias currents of the charge pump circuit and the replica charge pump circuit, the phase error between the PLL-generated clock that is generated by the PLL circuit and the reference clock that is applied as input to the PLL circuit can be minimized without regard to the charge pump input waveform, the process, the temperature, or the power supply voltage dependency.

The present invention has the following merits:

As the first merit, the phase error $\Delta t$ between reference clock REFCLK and the feedback clock FBCLK of the PLL-generated clock can be minimized. This effect is realized because the PLL circuit of the present invention is equipped with a replica charge pump circuit in which Isrc and Isnk are equal when in a locked-state, the reference voltage VpmpR that is generated by the replica charge pump circuit is compared with the PLL control voltage Vpmp to generate a correction voltage Vcmp of the charge pump bias circuit, whereby Isnk is regulated to minimize the error between Isrc and Isnk.

The second merit is the ability to minimize fluctuations in the phase error Δt between the reference clock REFCLK and the feedback clock FBCLK of the PLL-generated clock that result from the process, the temperature, the power supply voltage, and the input waveform to the charge pump circuit. This merit is achieved because the replica charge pump circuit that is always operating in a locked state constantly detects fluctuations in the Isrc and Isnk error that are caused by the process, the temperature, the power supply voltage, and the input waveform to the charge pump circuit and is therefore is able to, under any conditions, generate the reference voltage VpmpR of the time in which Isrc and Isnk are equal. The reference voltage VpmpR and the PLL control voltage Vpmp are compared to generate the correction voltage Vcmp of the charge pump bias circuit, whereby Isnk is regulated and the variation in the amount of error between Isrc and Isnk absorbed.

The above and other objects, features, and advantages of the present invention will become apparent from the following description with reference to the accompanying drawings, which illustrate examples of the present invention.

DETAILED DESCRIPTION OF THE PREFERRED EMBODIMENTS

First Embodiment of the Present Invention

The following explanation regards the details of the configuration of the first embodiment of the present invention with reference to the accompanying figures.

Figure 1:
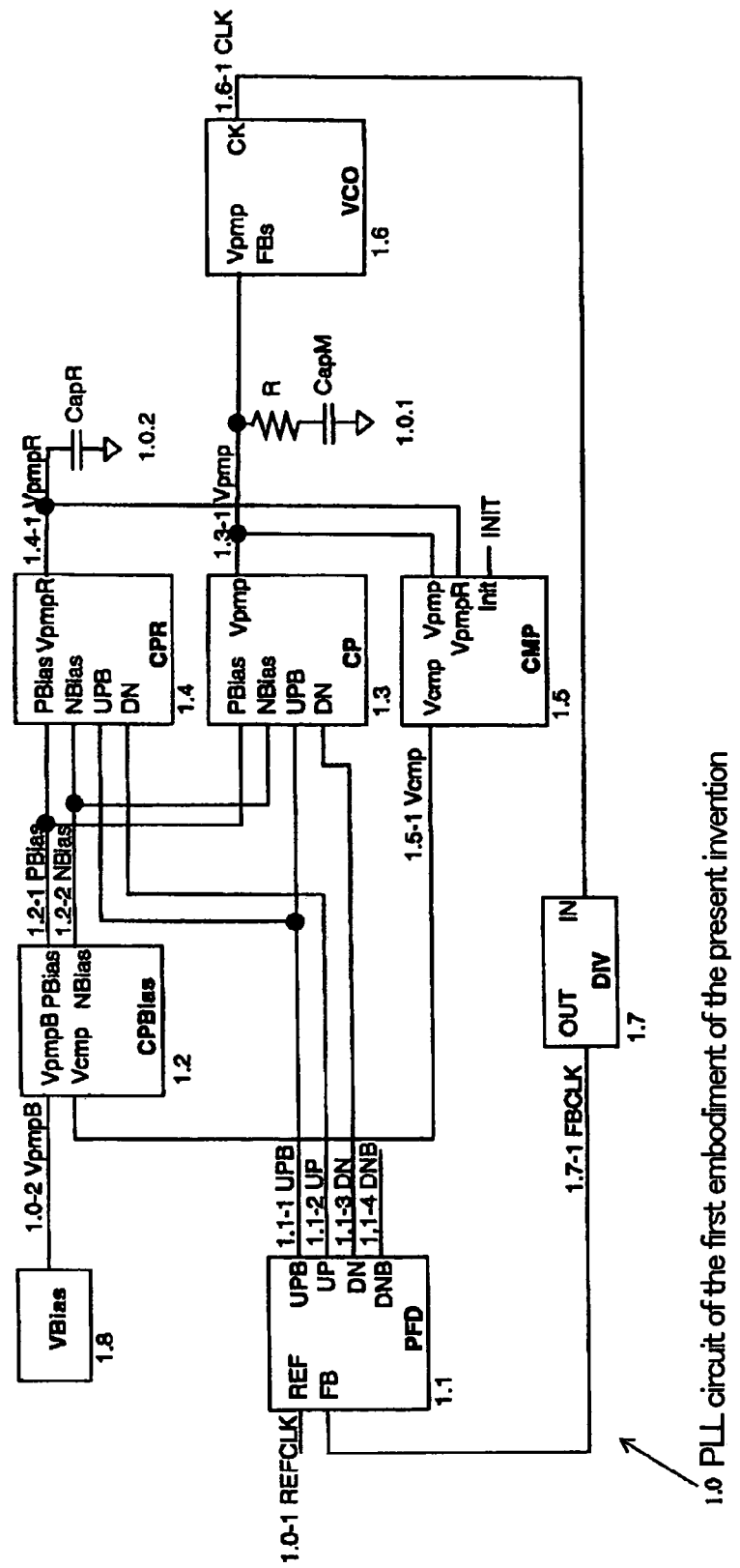
FIG. 1 is a block diagram showing the overall configuration of the PLL circuit of the first embodiment of the present invention.

FIG. 1 is a block diagram showing the overall configuration of PLL circuit 1.0 of the first embodiment of the present invention. PLL circuit 1.0 of the first embodiment of the present invention is composed of:

Phase/frequency detection circuit 1.1 is further composed of: data flip-flop circuits (D-F/F) 1.1.1 and 1.1.2, and reset circuit 1.1.3; Isnk-correction charge pump bias circuit 1.2 is further composed of bias current generation circuit 1.2.1, bias current mirror circuit 1.2.2, and bias current correction circuit 1.2.3; charge pump circuit 1.3 is further composed of Isrc-supply constant-current PMOS 1.3.1, Isrc switch PMOS 1.3.2, Isnk switch NMOS 1.3.3, and Isnk-supply constant-current NMOS 1.3.4; replica charge pump circuit 1.4 is further composed of Isrc-supply constant-current PMOS 1.4.1, Isrc switch PMOS 1.4.2, Isnk switch NMOS 1.4.4, and Isnk-supply constant-current NMOS 1.4.4; correction voltage generation circuit 1.5 is further composed of initializing circuit 1.5.1 and voltage comparison circuit 1.5.2; voltage-controlled oscillation circuit 1.6 is further composed of inverter circuits 1.6.1, 1.6.2, and 1.6.3; and frequency-dividing circuit 1.7 is further composed of data flip-flop circuits (D-F./F) 1.7.1 and 1.7.2 (in this case, a ½-frequency-dividing circuit).

Loop filter resistance circuit R and main capacitor CapM 1.0.1 are connected to the output of charge pump circuit 1.3; reference capacitor CapR 1.0.2 is connected to the output of replica charge pump circuit 1.4; and the output signals of phase/frequency detection circuit 1.1 and Isnk-correction charge pump bias circuit 1.2 are connected to the inputs of charge pump circuit 1.3 and replica charge pump circuit 1.4. The output signal of charge pump circuit 1.3 is connected to the input of voltage-controlled oscillation circuit 1.6, and the output signal of voltage-controlled oscillation circuit 1.6 is connected to the input of frequency-dividing circuit 1.7. The output signal of frequency-dividing circuit 1.7 is connected to the input of phase/frequency detection circuit 1.1. The output of replica charge pump circuit 1.4 and the output signal of charge pump circuit 1.3 are connected to the input of correction voltage generation circuit 1.5; and the output signal of correction voltage generation circuit 1.5 is connected to the input of Isnk-correction charge pump bias circuit 1.2. Reference clock REFCLK 1.0-1 that is applied as input from the outside is connected to the input of phase/frequency detection circuit 1.1. The desired bias voltage VpmpB 1.0-2 from reference bias voltage generation circuit 1.8 is connected to the input of Isnk-correction charge pump bias circuit 1.2.

Figure 2:
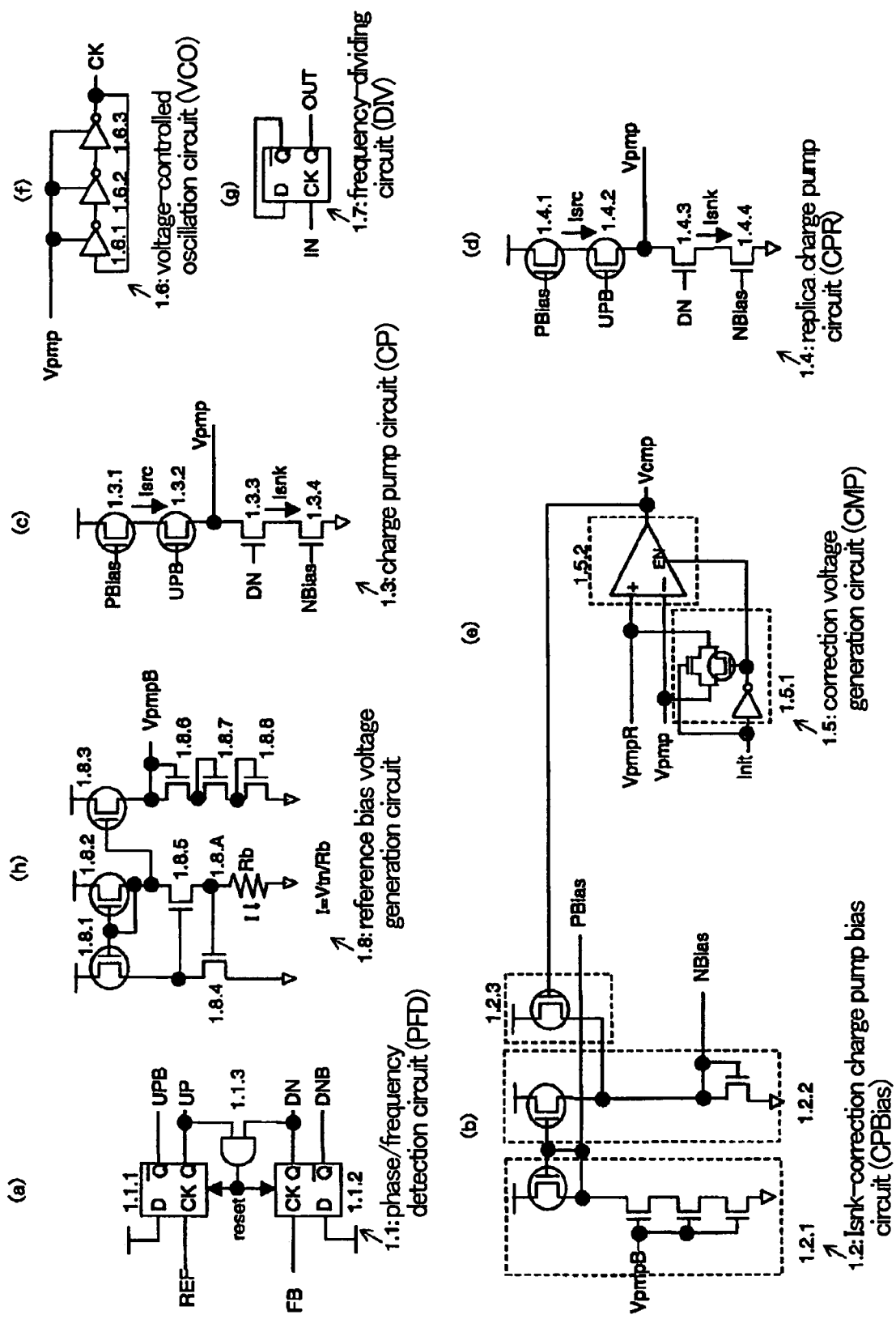
FIG. 2 shows the configuration of each circuit that makes up the PLL circuit of the first embodiment of the present invention.

FIG. 2(*a*) shows phase/frequency detection circuit 1.1. The phase/frequency detection circuit detects the phase difference and frequency difference between reference clock REFCLK 1.0-1 and the feedback clock FBCLK 1.7-1 of the PLL-generated clock that is generated by the PLL circuit that are applied as input to data flip-flop circuits (D-F/F) 1.1.1 and 1.1.2, respectively, and generates phase/frequency amplification signal UP, its complementary signal UPB, phase/frequency attenuation signal DN, and its complementary signal DNB, each having a pulse width that accords with the phase difference and frequency difference.

FIG. 2(*b*) shows Isnk-correction charge pump bias circuit 1.2. In order to determine the charge/discharging current Isrc/Isnk of loop filter-resistance circuit R that is connected to the output of charge pump circuit 1.3, Isrc bias voltage PBias 1.2-1 for Isrc is generated from reference bias voltage VpmpB 1.0-2 by bias current generation circuit 1.2.1, and Isnk bias voltage NBias 1.2-2 for Isnk is generated in bias current mirror circuit 1.2.2. In addition, Isnk-correction NMOS 1.2.3 is provided for receiving the correction voltage that is generated by correction voltage generation circuit 1.5 and regulating Isnk to the desired value.

FIG. 2(*c*) shows charge pump circuit 1.3. This charge pump circuit 1.3 is composed of: Isrc-supply constant-current PMOS 1.3.1 for generating an Isrc-supply constant-current from Isrc bias voltage PBias 1.2-1 for Isrc that has been determined by Isnk-correction charge pump bias circuit 1.2; Isrc switch PMOS 1.3.2 for supplying Isrc to loop filter-resistance circuit R during the time interval in which the phase/frequency amplification signal UPB that is supplied as output by phase/frequency detection circuit 1.1 is "L" (low level); and similarly, Isnk-supply constant-current NMOS 1.3.4 for generating an Isnk-supply constant-current from Isnk bias voltage NBias 1.2-2 for Isnk that has been determined by Isnk-correction charge pump bias circuit 1.2; and Isnk switch NMOS 1.3.3 for supplying Isnk to loop filter-resistance circuit R during the time interval in which the phase/frequency attenuation signal DN is "H" (high level). Loop filter-resistance circuit R and main capacitor CapM 1.0.1 are connected to the output, and the PLL control voltage Vpmp 1.3-1 of voltage-controlled oscillation circuit 1.6 is generated.

FIG. 2(*d*) shows replica charge pump circuit 1.4. The configuration is the same as that of charge pump circuit 1.3, and detailed explanation of similar portions is therefore here omitted. Phase/frequency amplification signal UPB is applied as input to Isrc switch PMOS 1.4.2, and the complementary signal UP of UPB is applied as input to Isnk switch NMOS 1.4.3. The UPB and UP signal waveforms in replica charge pump circuit 1.4 are equal to the signal waveforms of phase/frequency amplification signal UPB and phase/frequency attenuation signal DN that are applied as input when the PLL circuit is locked in an ideal state with no phase error with the reference signal, and as a result, replica charge pump circuit 1.4 always operates in an ideal locked state, supplies Isrc and Isnk to reference capacitor CapR 1.0.2 that is connected to its output, and generates reference voltage VpmpR 1.4-1 by which Isrc=Isnk.

FIG. 2(*e*) shows correction voltage generation circuit 1.5. Correction voltage generation circuit 1.5 is provided with initializing circuit 1.5.1 and sets PLL control voltage Vpmp 1.3-1 of voltage-controlled oscillation circuit 1.6 and reference voltage VpmpR 1.4-1 to the same phase when PLL circuit 1.0 begins operations or is reset. Voltage comparison circuit 1.5.2 is provided for constantly comparing reference voltage VpmpR 1.4-1 and PLL control voltage Vpmp 1.3-1 of voltage-controlled oscillation circuit 1.6 and generating the differential voltage as correction voltage Vcmp 1.5-1 during the operation of PLL circuit 1.0.

FIG. 2(*f*) shows voltage-controlled oscillation circuit 1.6. A ring oscillator is configured by the three stages of inverter circuits 1.6.1, 1.6.2, and 1.6.3; and change in the delay of inverter circuits 1.6.1, 1.6.2, and 1.6.3 that is caused by PLL control voltage Vpmp 1.3-1 enables change and control of the oscillation frequency of the ring oscillator.

FIG. 2(*g*) shows frequency-dividing circuit 1.7. A binary counter is realized by data flip-flop circuits (D-F/F) 1.7.1 and 1.7.2, and the frequency of the clock signal that is applied as input is divided in half. In this frequency-dividing circuit, an example is shown of a ½-frequency-dividing circuit, but when feedback clock FBCLK 1.7-1 of the PLL-generated clock CLK 1.6-1 that is generated by the PLL circuit must be a frequency that is an n-multiple of the reference clock REFCLK 1.0-1, a 1/n-frequency-dividing circuit may be prepared as necessary.

FIG. 2(*h*) shows reference bias voltage generation circuit 1.8. Reference bias voltage generation circuit 1.8 generates reference bias voltage VpmpB 1.0-2 and supplies the reference bias voltage VpmpB 1.0-2 to Isnk-correction charge pump bias circuit 1.2.

The following explanation regards the operation of the first embodiment of the present invention.

Figure 3:
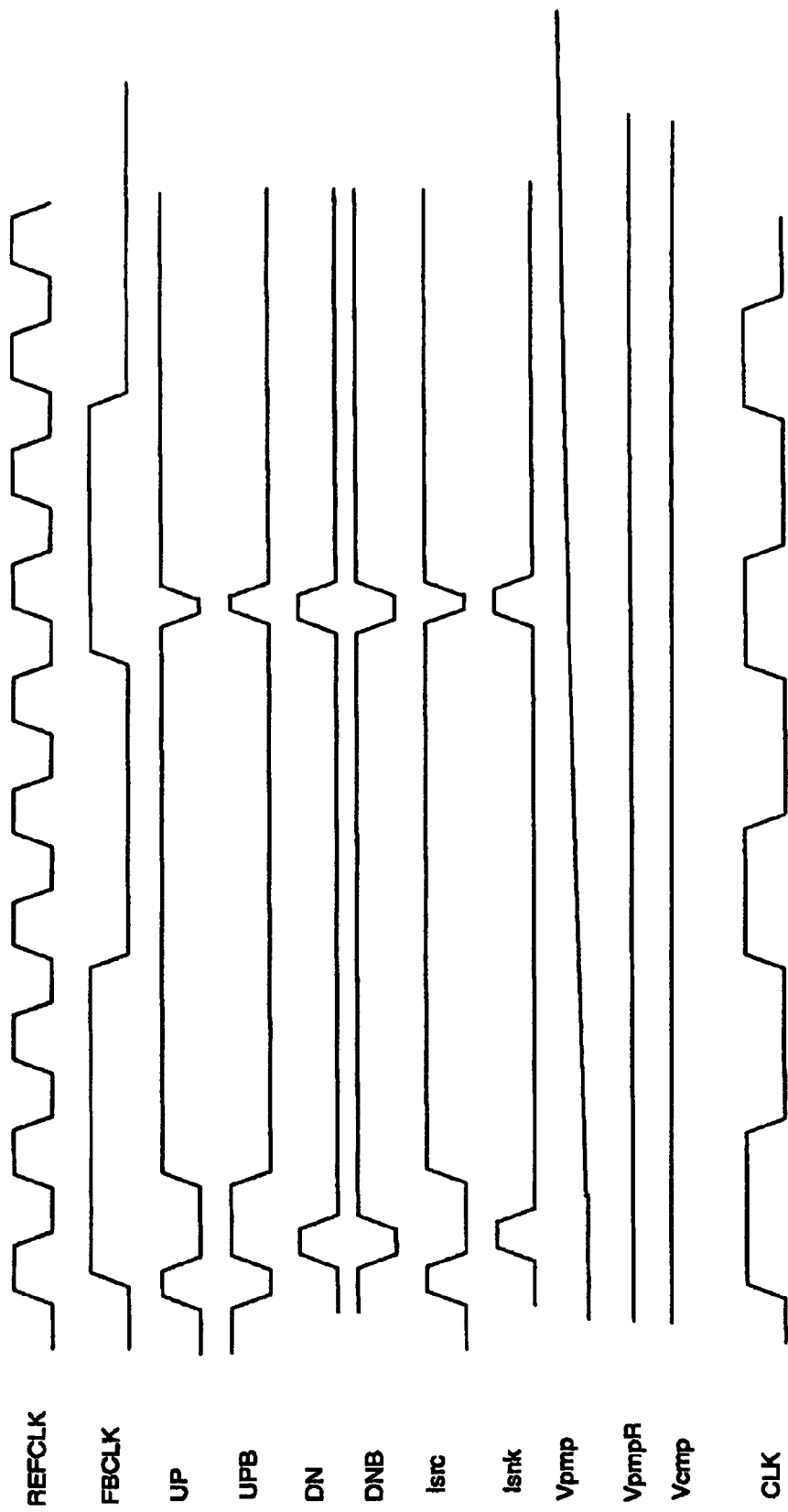
FIG. 3 shows a timing chart for explaining the operation of the first embodiment of the present invention.

FIG. 3 shows a timing chart. Phase/frequency detection circuit 1.1 sets phase/frequency amplification signal UP/UPB at the rising edge of reference clock REFCLK 1.0-1, and sets phase/frequency attenuation signal DN/DNB at the rising edge of the feedback clock FBCLK 1.7-1 of the PLL-generated clock. When the frequency of the feedback clock FBCLK 1.7-1 of the PLL-generated clock is delayed from reference clock REFCLK 1.0-1, UP/UPB and DN/DNB signal are reset with the set timing of DN/DNB signal as a trigger as shown in FIG. 3. As a result, PLL control voltage Vpmp 1.3-1 increases, and the frequencies of PLL-generated clock CLK 1.6-1, which is the output clock of voltage-controlled oscillation circuit 1.6, and the feedback clock FBCLK 1.7-1 of the PLL-generated clock increase. When the reference clock REFCLK 1.0-1 is delayed from the feedback clock FBCLK 1.7-1 of the PLL-generated clock, the PLL control voltage Vpmp 1.3-1 decreases by the reverse operation.

Figure 4:
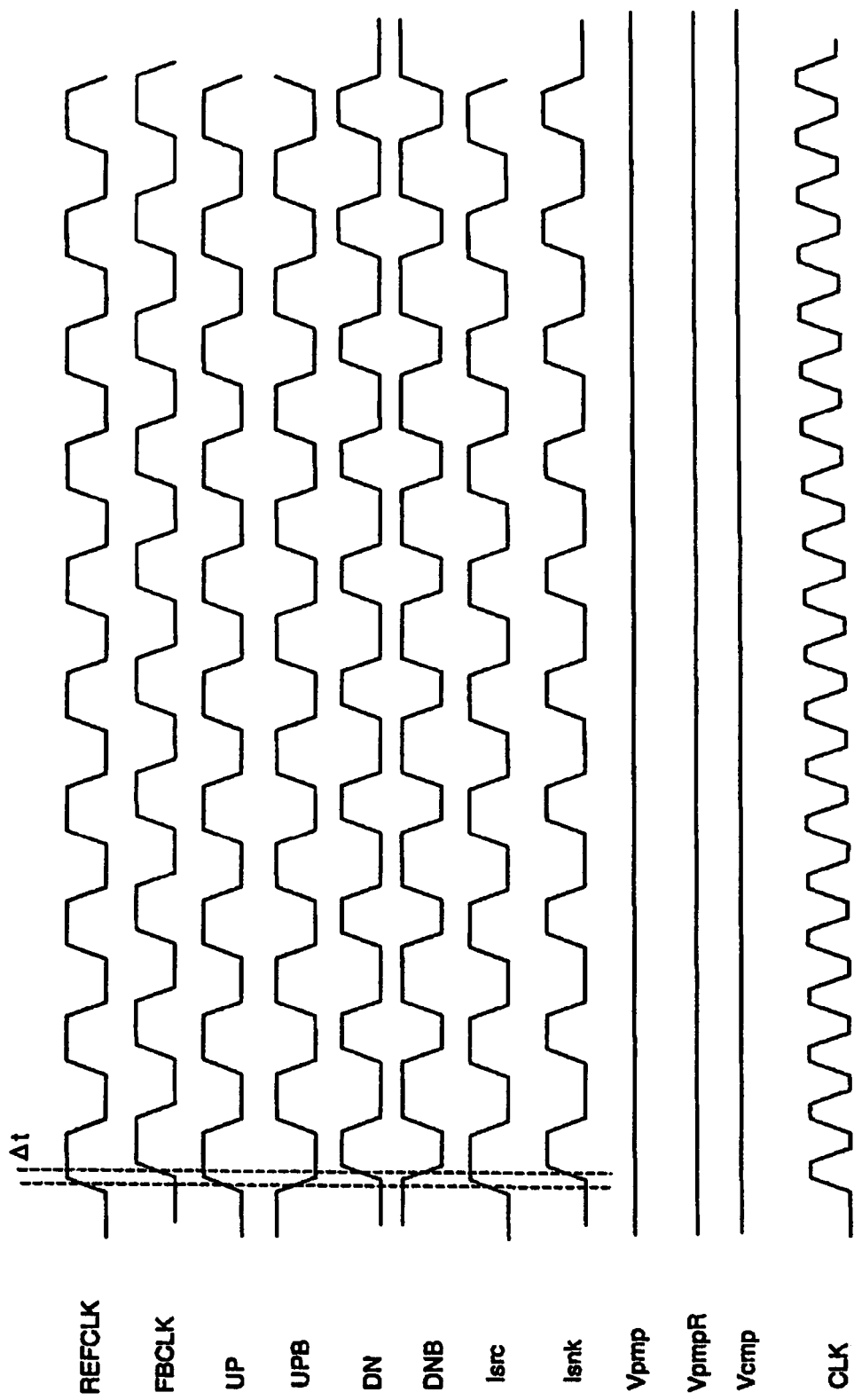
FIG. 4 shows a timing chart of the PLL circuit when locked.

FIG. 4 shows a timing chart of the PLL circuit when locked. Reference clock REFCLK 1.0-1 and the feedback clock FBCLK 1.7-1 of the PLL-generated clock reach the same frequency and their phases produce a slight phase error Δt and achieve stable operation. The feedback clock FBCLK 1.7-1 of the PLL-generated clock is slightly delayed from the reference clock REFCLK 1.0-1 and stable, and as a result, the pulse width of UP/UPB is longer than that of DN/DNB by Δt, with the result that the pulse width of Isrc is also exactly Δt longer than that of Isnk. This slight phase error Δt occurs because, although ideally, Isrc and Isnk should be equal, such factors as the Early effect of Isrc-supply constant-current PMOS 1.3.1 and Isnk-supply constant-current NMOS 1.3.4 in charge pump circuit 1.3 and the occurrence of a difference in threshold value between Isrc switch PMOS 1.3.2 and Isnk switch NMOS 1.3.3 prevent Isrc and Isnk from becoming equal, the difference between Isrc and Isnk is normally absorbed by the difference in the pulse widths of UPB and DN.

However, in PLL circuit 1.0 of the embodiments of the present invention, reference voltage VpmpR 1.4-1 is generated by replica charge pump circuit 1.4 such that Isrc and Isnk are always equal, this reference voltage VpmpR 1.4-1 is compared with PLL control voltage Vpmp 1.3-1 in correction voltage generation circuit 1.5, and Isnk is corrected in Isnk-correction charge pump bias circuit 1.2 such that reference voltage VpmpR 1.4-1 and PLL control voltage Vpmp 1.3-1 are equal, whereby the error between Isrc and Isnk is minimized, and the phase difference Δt between reference clock REFCLK 1.0-1 and feedback clock FBCLK 1.7-1 of the PLL-generated clock is minimized.

In addition, the embodiments of the present invention also minimize fluctuation of Δt that changes due to fluctuation in the amount of error between Isrc and Isnk that is caused by fluctuation in the Early effect resulting from: fluctuation in the threshold value voltages of Isrc switch PMOS 1.3.2 and Isnk switch NMOS 1.3.3 that is caused by the process or the temperature; fluctuation in the waveform of the phase/frequency amplification signal UP/UPB and phase/frequency attenuation signal DN/DNB that are applied as input to Isrc switch PMOS 1.3.2 and Isnk switch NMOS 1.3.3; and fluctuation of VDS (the voltage across the drain and source) of Isrc-supply constant-current PMOS 1.3.1 and Isnk-supply constant-current NMOS 1.3.4 that is produced by the difference between the power supply voltage and PLL control voltage Vpmp 1.3-1. For example, at a clock of 400 MHz the pulse width of the clock is 1250 ps, and a rise time interval from the "L" clock to the "H" clock of 100 ps will amount to 8% of the clock pulse, meaning that as the frequency of the clock increases, the influence of the rise and fall waveforms of the UP/DN waveforms can no longer be ignored.

Figure 5:
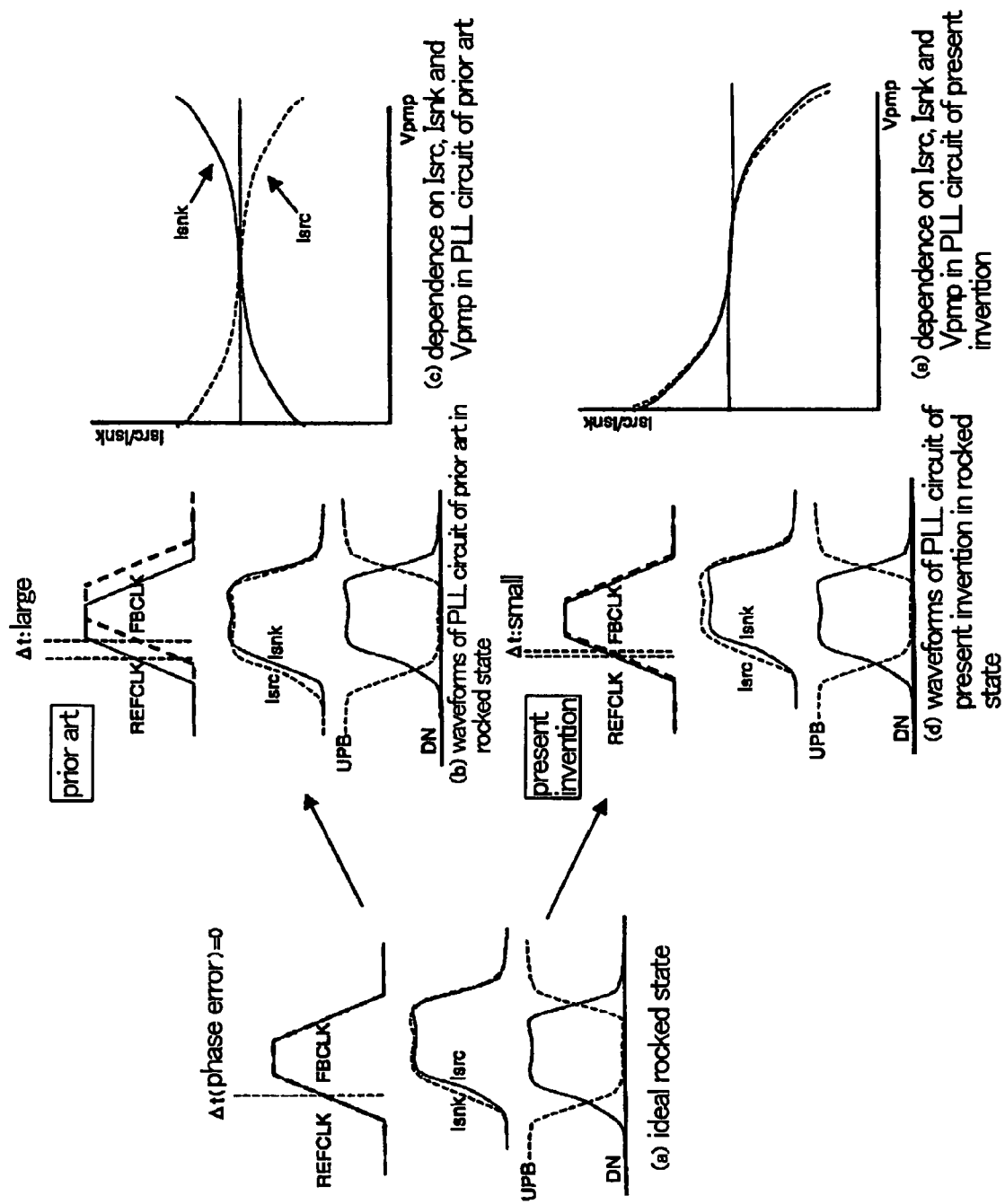
FIG. 5 shows a timing chart of the operation of phase/frequency amplification signal UPB and phase/frequency attenuation signal DN that produce the phase difference Δt when locked.

FIG. 5 shows an operational timing chart of phase/frequency amplification signal UPB and phase/frequency attenuation signal DN that are the origin of phase error Δt during locked operation. Because the threshold value voltages Vt for PMOS and NMOS normally differ, Isrc and Isnk will also differ even when UPB and DN of the same pulse width are applied as input, and PLL control voltage Vpmp therefore cannot be maintained and will either increase or decrease. However, control is effected such that the overall PLL circuit stabilizes at the same frequency and Vpmp is therefore maintained, whereby the phase error Δt is produced between the reference clock REFCLK and the feedback clock FBCLK of the PLL-generated clock and the pulse width of Isrc and Isnk change to equalize Isrc and Isnk and maintain PLL control voltage Vpmp. In PLL circuit 1.0 of the embodiment of the present invention, however, control is implemented to equalize Isrc and Isnk by correcting of Isnk (or Isrc), and the phase error Δt between the reference clock REFCLK 1.0-1 and the feedback clock FBCLK 1.7-1 of the PLL-generated clock is minimized.

Second Embodiment of the Present Invention

The following explanation regards the details of the second embodiment of the present invention with reference to the accompanying figures.

Figure 6:
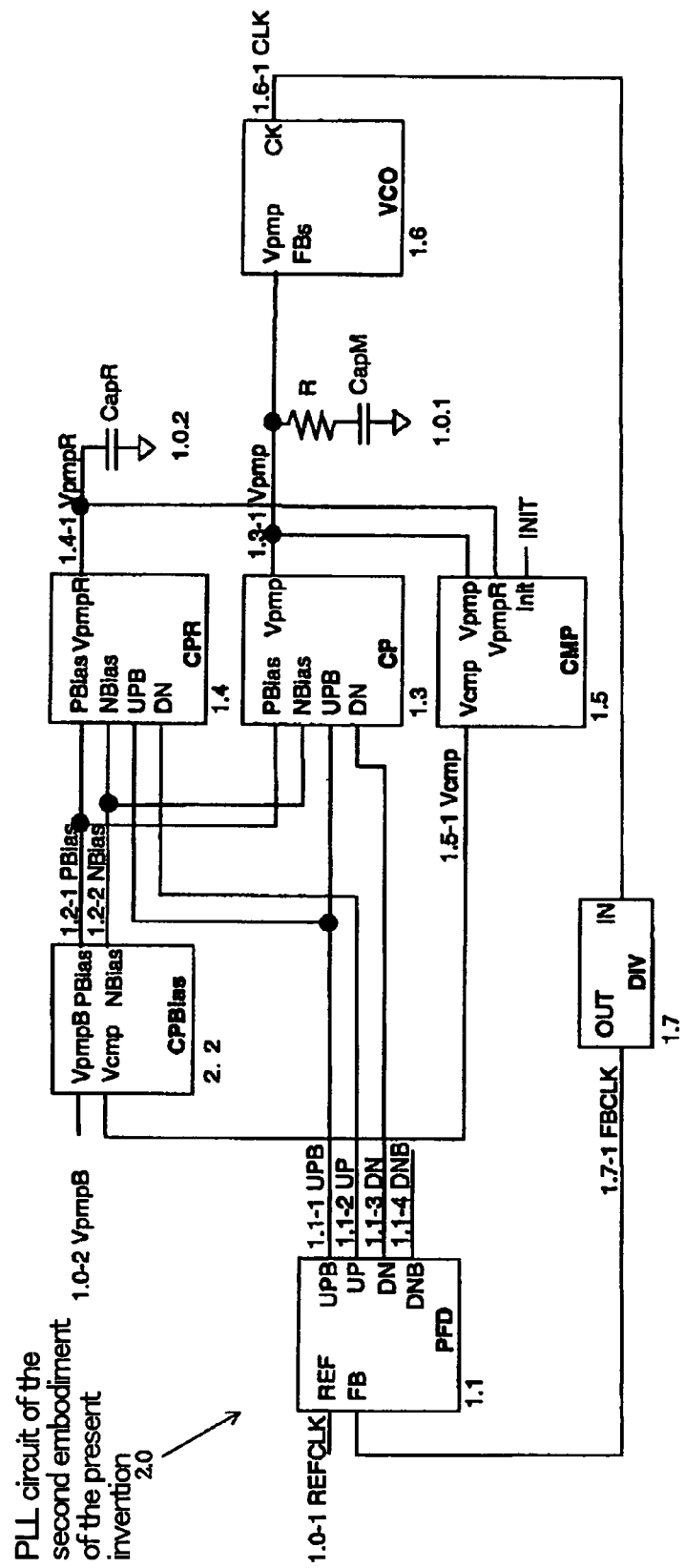
FIG. 6 is a block diagram showing the overall configuration of the PLL circuit of the second embodiment of the present invention.

FIG. 6 is a block diagram showing the overall configuration of PLL circuit 2.0 of the second embodiment of the present invention. Although no changes are made to the block configuration of the first embodiment, the circuit configuration of Isnk-correction charge pump bias circuit 1.2 is changed to Isrc-correction charge pump bias circuit 2.2, and the effect that was obtained by correcting Isnk in the first embodiment is obtained by correcting Isrc in the second embodiment.

Figure 7:
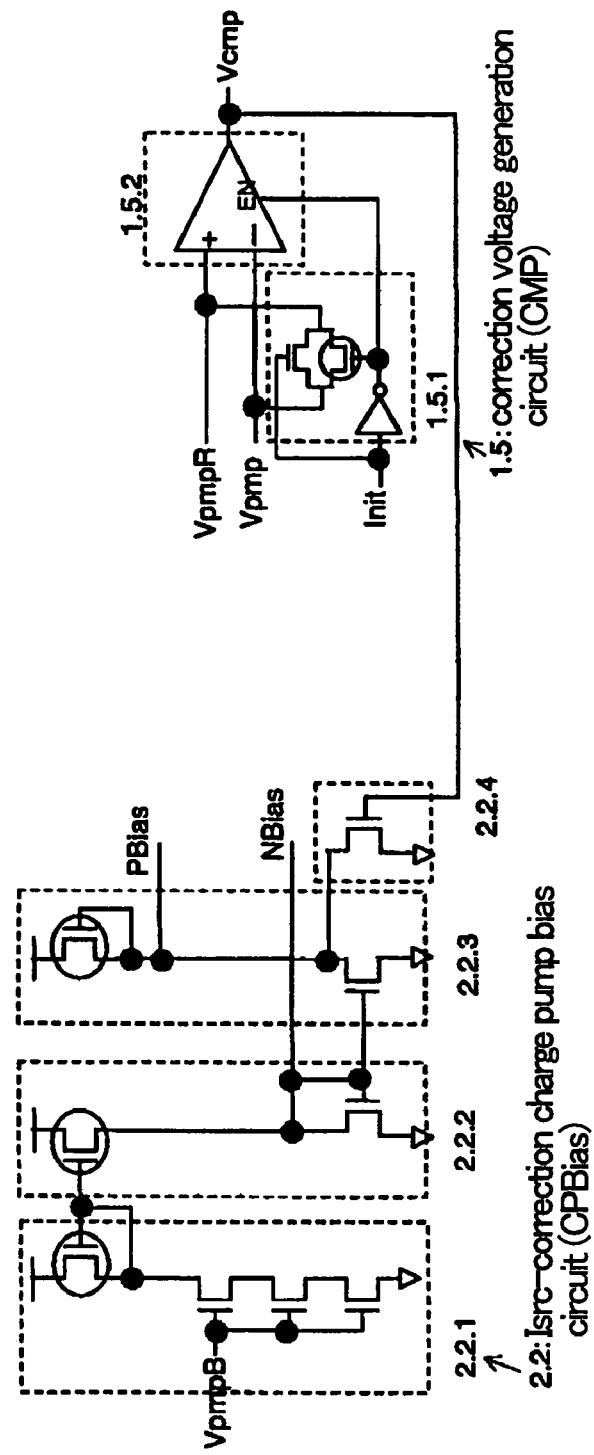
FIG. 7 shows the Isrc-correction charge pump bias circuit.

FIG. 7 shows Isrc-correction charge pump bias circuit 2.2. This Isrc-correction charge pump bias circuit 2.2 is composed of: bias current generation circuit 2.2.1 for obtaining a desired Isrc and Isnk; bias current mirror circuit 2.2.2 for converting the bias current to Isnk bias voltage NBias that determines Isnk; bias current mirror circuit 2.2.3 for converting the bias current to Isrc bias voltage PBias for determining Isrc; and Isrc-correction NMOS 2.2.4 for regulating Isrc based on correction voltage Vcmp that is generated by correction voltage generation circuit 1.5. This embodiment obtains the same effect as the first embodiment.

Third Embodiment of the Present Invention

The following explanation regards the details of the third embodiment of the present invention with reference to the accompanying figures.

Figure 8:
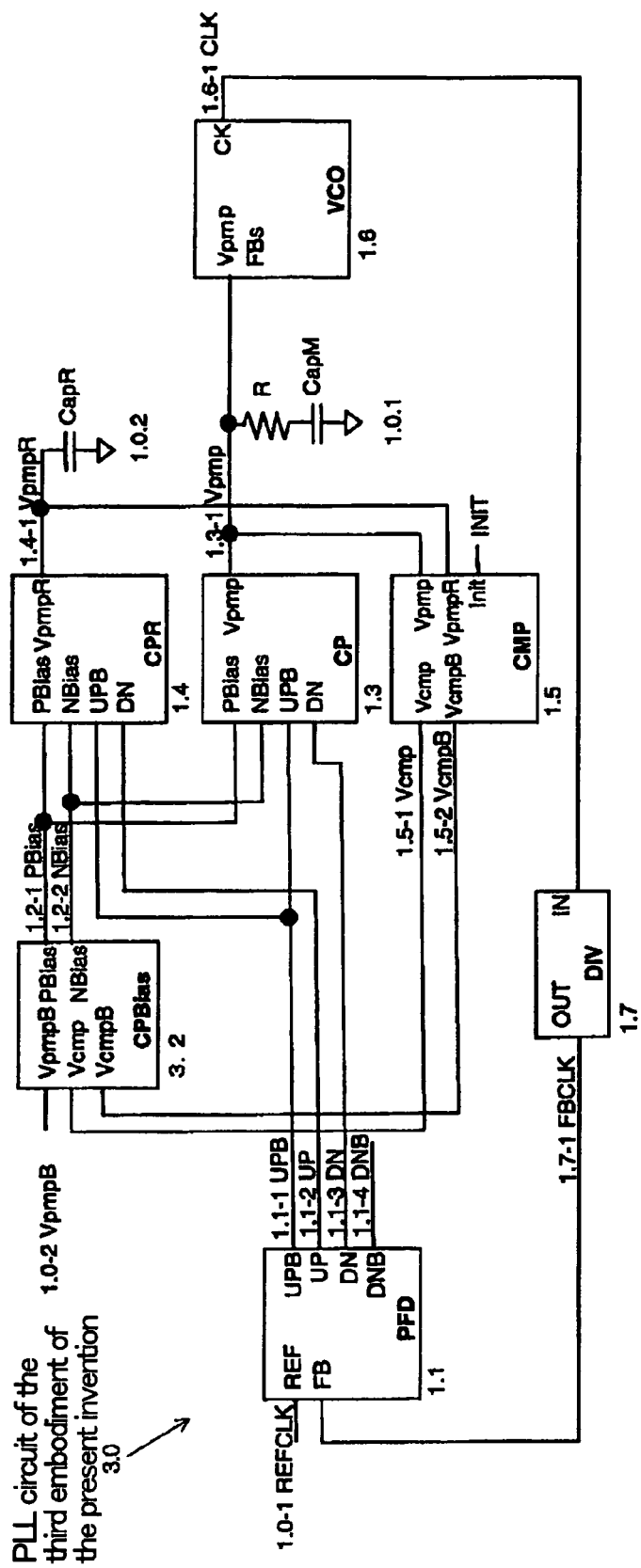
FIG. 8 is a block diagram showing the overall configuration of the PLL circuit of the third embodiment of the present invention.
Figure 9:
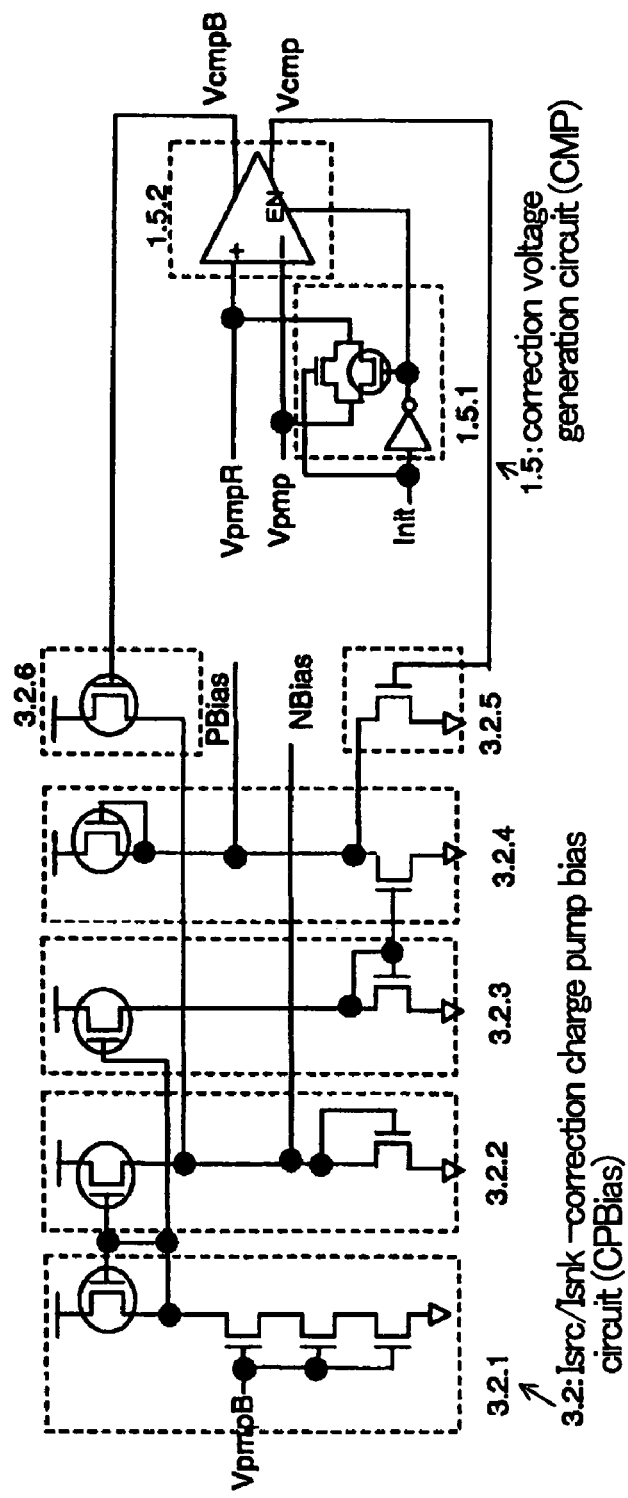
FIG. 9 shows the Isrc/Isnk-correction charge pump bias circuit.

FIG. 8 is a block diagram showing the overall configuration of PLL circuit 3.0 of the third embodiment of the present invention. As a block configuration, this configuration is not altered from that of the first embodiment, but the circuit configuration of Isnk-correction charge pump bias circuit 1.2 is altered to Isrc/Isnk-correction charge pump bias circuit 3.2, and the effect that was obtained by correcting Isnk in the first embodiment is obtained by correcting both Isrc and Isnk in the third embodiment. FIG. 9 shows Isrc/Isnk-correction charge pump bias circuit 3.2. Isrc/Isnk-correction charge pump bias circuit 3.2 is composed of: bias current generation circuit 3.2.1 for obtaining desired Isrc and Isnk; bias current mirror circuit 3.2.2 for converting from the bias current to Isnk bias voltage NBias for determining Isnk; bias current mirror circuits 3.2.3 and 3.2.4 for converting from the bias current to Isrc bias voltage PBias for determining Isrc; Isrc-correction NMOS 3.2.5 for regulating Isrc by means of correction voltage Vcmp that is generated by correction voltage generation circuit 1.5; and Isnk-correction PMOS 3.2.6 for similarly regulating Isnk by means of correction voltage VcmpB that is the complement of correction voltage Vcmp that is generated by correction voltage generation circuit 1.5. This embodiment obtains the same effect as the first embodiment.

Fourth Embodiment of the Present Invention

The following explanation regards the details of the fourth embodiment of the present invention with reference to the accompanying figures.

Figure 10:
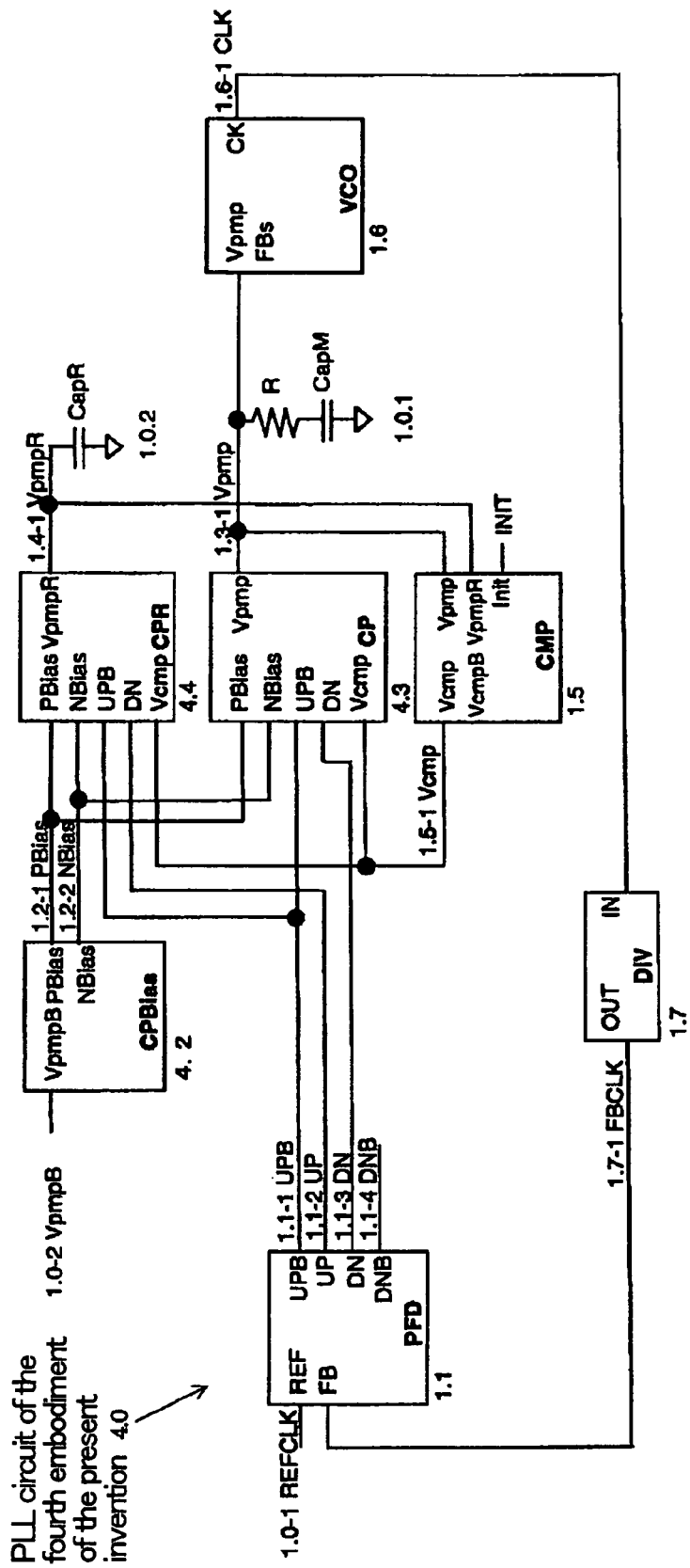
FIG. 10 is a block diagram showing the overall configuration of the PLL circuit of the fourth embodiment of the present invention.

FIG. 10 is a block diagram showing the overall configuration of PLL circuit 4.0 of the fourth embodiment of the present invention. As a block configuration, Isnk-correction charge pump bias circuit 1.2 from the first embodiment is changed to non-corrective charge pump bias circuit 4.2; and charge pump circuit 1.3 and replica charge pump circuit 1.4 are changed to Isnk-correction charge pump circuit 4.3 and Isnk-correction replica charge pump circuit 4.4. In contrast to the first to third embodiments in which an effect is obtained by correcting Isrc and Isnk in the charge pump bias circuit, the effect is obtained in the present embodiment by correcting Isnk in Isnk-correction charge pump circuit 4.3 and Isnk-correction replica charge pump circuit 4.4.

Figure 11A:
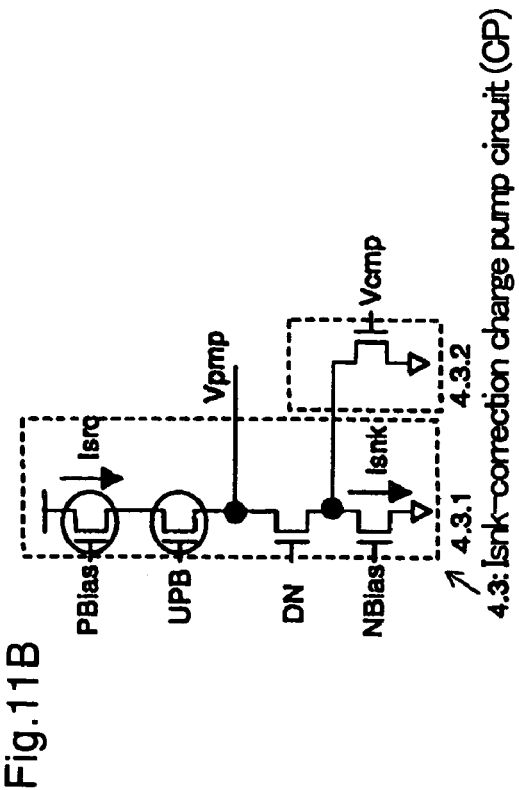
FIG. 11A shows the non-corrective charge pump bias circuit.

FIG. 11A shows non-corrective charge pump bias circuit 4.2. This non-corrective charge pump bias circuit 4.2 is composed of: bias current generation circuit 4.2.1 for obtaining the desired Isrc and Isnk current; and bias current mirror circuit 4.2.2 for converting from the bias current to Isrc bias voltage PBias for determining Isrc and Isnk bias voltage NBias for determining Isnk.

Figure 11B:
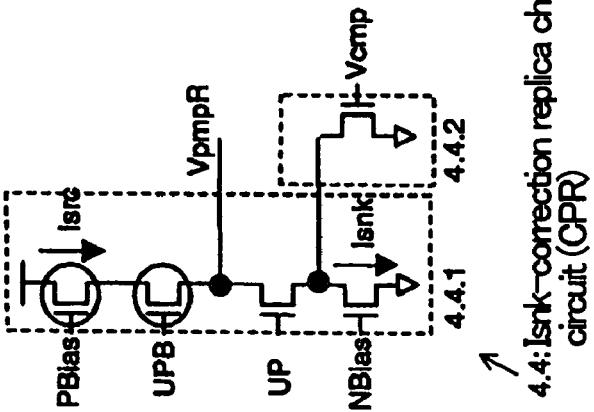
FIG. 11B shows the Isnk-correction charge pump circuit.

FIG. 11B shows Isnk-correction charge pump circuit 4.3. This Isnk-correction charge pump circuit 4.3 is of a configuration in which Isnk-correction NMOS 4.3.2 is added to charge pump circuit 4.3.1 that is identical to charge pump circuit 1.3 of FIG. 2(*c*), wherein the application of correction voltage Vcmp 1.5-1 of correction voltage generation circuit 1.5 as input realizes the correction of Isnk and obtains the same effect as in the first embodiment.

Figure 11C:
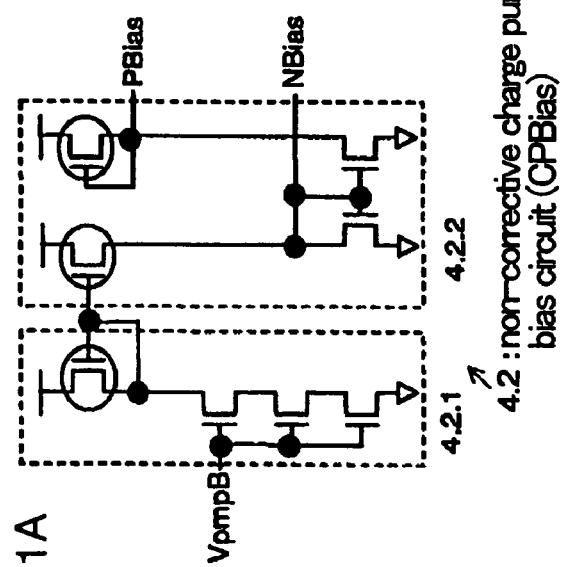
FIG. 11C shows the Isnk-correction replica charge pump circuit.

FIG. 11C shows Isnk-correction replica charge pump circuit 4.4. This circuit is of the same circuit configuration as Isnk-correction charge pump circuit 4.3, and similarly applies correction voltage Vcmp 1.5-1 as feedback input to Isnk-correction NMOS 4.4.2 and supplies as output an appropriate reference voltage VpmpR 1.4-1 according to PLL control voltage Vpmp 1.3-1.

Fifth Embodiment of the Present Invention

The following explanation regards the details of the fifth embodiment of the present invention with reference to the accompanying figures.

Figure 12:
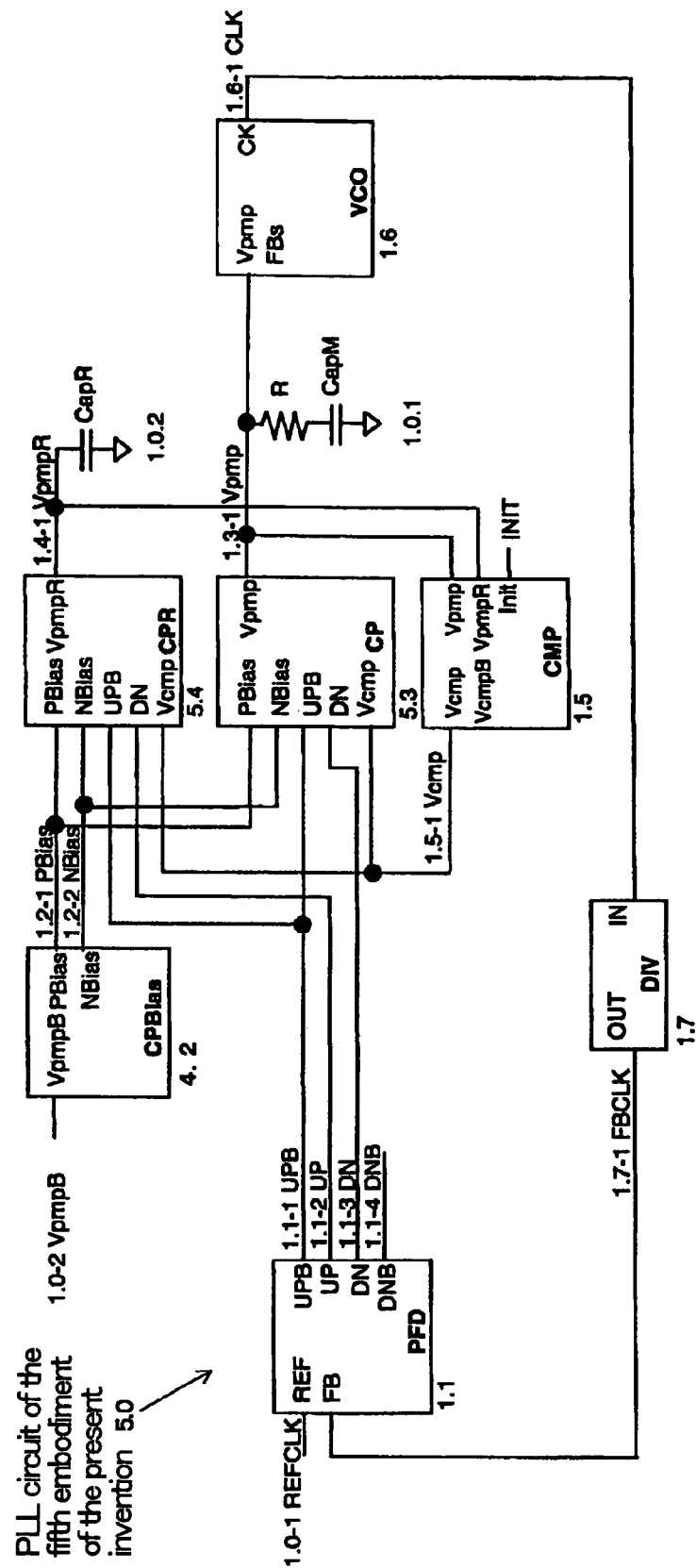
FIG. 12 is a block diagram showing the overall configuration of the PLL circuit of the fifth embodiment of the present invention.

FIG. 12 is a block diagram showing the overall configuration of PLL circuit 5.0 of the fifth embodiment of the present invention. As a block configuration, this embodiment changes Isnk-correction charge pump circuit 4.3 and Isnk-correction replica charge pump circuit 4.4 from the fourth embodiment to Isrc-correction charge pump circuit 5.3 and Isrc-correction replica charge pump circuit 5.4 to obtain the same effect as the fourth embodiment.

Figure 13A:
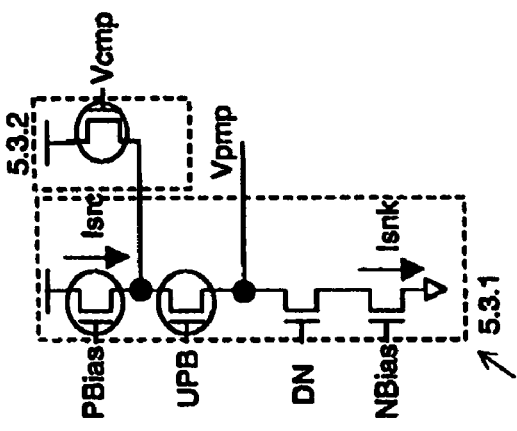
FIG. 13A shows the Isrc-correction charge pump circuit.

FIG. 13A shows Isrc-correction charge pump circuit 5.3. This Isrc-correction charge pump circuit 5.3 is of a circuit configuration in which Isrc-correction PMOS 5.3.2 is added to charge pump circuit 5.3.1 that is identical to charge pump circuit 1.3 of FIG. 2(c), and by receiving as input correction voltage Vcmp 1.5-1 of correction voltage generation circuit 1.5, corrects Isrc and obtains the same effect as the fourth embodiment.

Figure 13B:
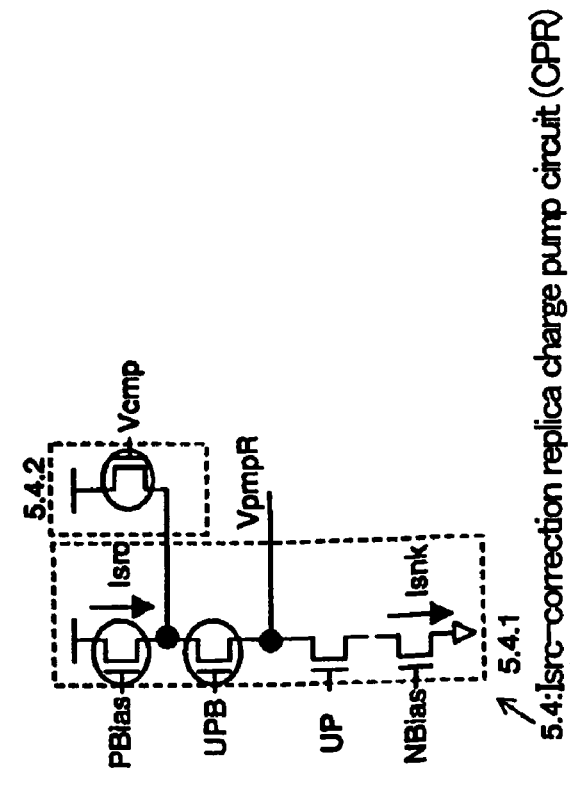
FIG. 13B shows the Isrc-correction replica charge pump circuit.

FIG. 13B shows Isrc-correction replica charge pump circuit 5.4. This Isrc-correction replica charge pump circuit 5.4 is of the same circuit configuration as Isrc-correction charge pump circuit 5.3 of FIG. 13A, and similarly applies correction voltage Vcmp 1.5-1 as feedback input to Isrc-correction PMOS 5.4.2 to supply as output an appropriate reference voltage VpmpR 1.4-1 according to PLL control voltage Vpmp 1.3-1.

Sixth Embodiment of the Present Invention

The following explanation regards the details of the sixth embodiment of the present invention with reference to the accompanying figures.

Figure 14:
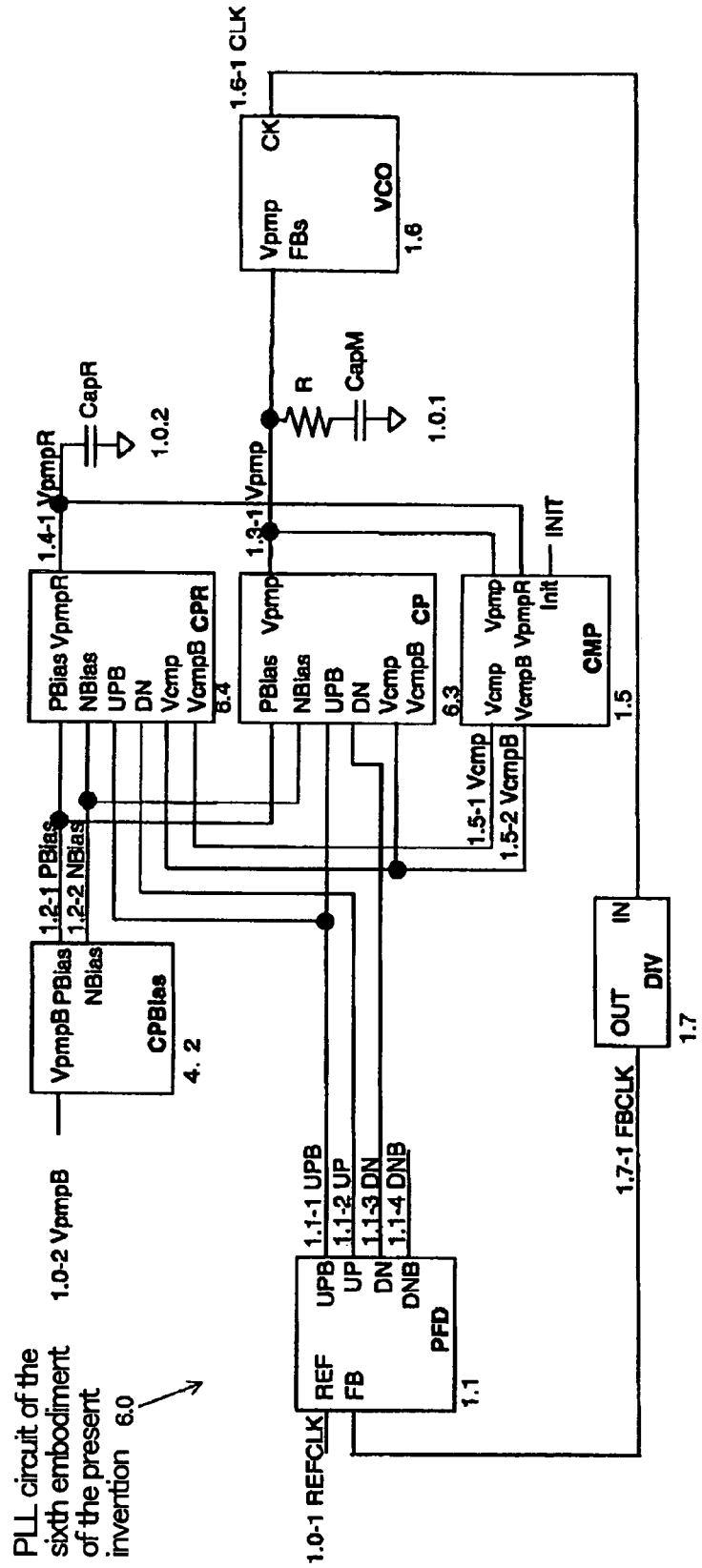
FIG. 14 is a block diagram showing the overall configuration of the PLL circuit of the sixth embodiment of the present invention.

FIG. 14 is a block diagram showing the overall configuration of PLL circuit 6.0 of the sixth embodiment of the present invention. As a block configuration, the present invention changes Isnk-correction charge pump circuit 4.3 and Isnk-correction replica charge pump circuit 4.4 from the fourth embodiment to Isrc/Isnk-correction charge pump circuit 6.3 and Isrc/Isnk correction replica charge pump circuit 6.4 of FIG. 15 to obtain the same effect as the fourth embodiment.

Figure 15A:
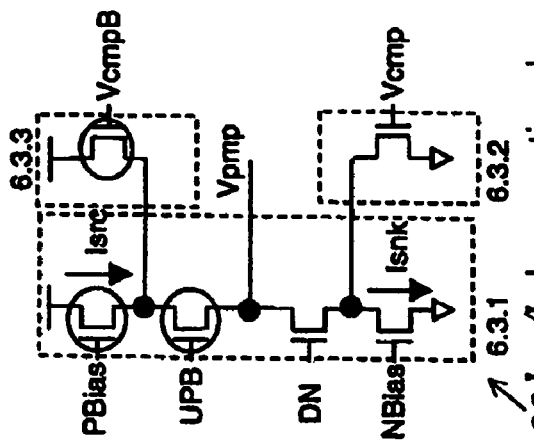
FIG. 15A shows the Isrc- and Isnk-correction charge pump circuits.

FIG. 15A shows Isrc/Isnk correction charge pump circuit 6.3. Isrc/Isnk correction charge pump circuit 6.3 is of a circuit configuration in which Isnk-correction NMOS 6.3.2 and Isrc-correction PMOS 6.3.3 have been added to charge pump circuit 6.3.1 that is identical to charge pump circuit 1.3 of FIG. 2(c). By applying correction voltage Vcmp 1.5-1 of correction voltage generation circuit 1.5 as input to Isnk-correction NMOS 6.3.2, Isnk is corrected and the same effects are obtained as in the fourth embodiment. By similarly applying correction voltage VcmpB 1.5-2, which is the complement of correction voltage Vcmp that is generated by correction voltage generation circuit 1.5, as input to Isrc-correction PMOS 6.3.3, Isrc is corrected, and the same effect is obtained as in the fifth embodiment.

Figure 15B:
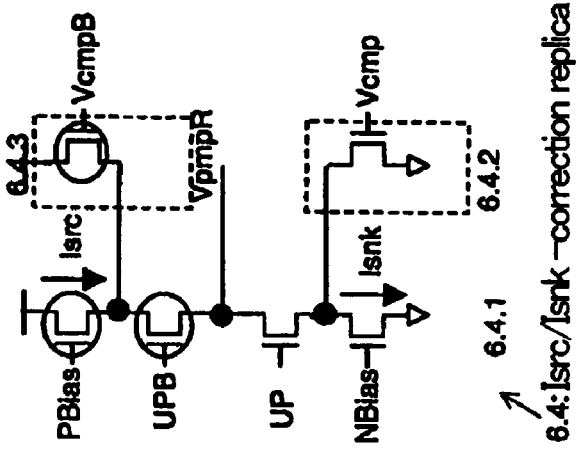
FIG. 15B shows the Isrc- and Isnk correction replica charge pump circuits.

FIG. 15B shows Isrc/Isnk correction replica charge pump circuit 6.4. Isrc/Isnk correction replica charge pump circuit 6.4 is of the same circuit configuration as Isrc/Isnk correction charge pump circuit 6.3 of FIG. 15A, and by similarly applying correction voltage Vcmp 1.5-1 as feedback input to Isnk-correction NMOS 6.4.2, supplies as output appropriate reference voltage VpmpR 1.4-1 that accords with PLL control voltage Vpmp 1.3-1. Isrc/Isnk correction replica charge pump circuit 6.4 similarly applies correction voltage VcmpB 1.5-2, which is the complement of correction voltage Vcmp that is generated by correction voltage generation circuit 1.5, as feedback input to Isrc-correction PMOS 6.4.3 to supply as output an appropriate reference voltage VpmpR 1.4-1 that accords with PLL control voltage Vpmp 1.3-1.

A program of the PLL circuit for each of the above-described embodiments of the present invention can cause a microprocessor to function as a PLL circuit.

While preferred embodiments of the present invention have been described using specific terms, such description is for illustrative purposes only, and it is to be understood that changes and variations may be made without departing from the spirit or scope of the following claims.

What is claimed is:

1. A PLL circuit comprising:
   a phase/frequency detection circuit for detecting a phase difference and frequency difference between a reference clock that is received as input from an outside and a clock that is generated by the PLL circuit, and for generating and supplying as output a phase/frequency amplification signal and a phase/frequency attenuation signal having pulse widths that accord with the phase difference and frequency difference as well as complementary signals of these signals;
   a charge pump bias circuit for receiving a reference bias voltage as input and generating and supplying as output a first charging current bias voltage and a first discharging current bias voltage;
   a charge pump circuit for supplying charging current in accordance with said first charging current bias voltage, supplying discharging current in accordance with the first discharging current bias voltage, and generating and supplying as output a PLL control voltage;
   a voltage-controlled oscillation circuit for receiving said PLL control voltage and generating a clock; and
   a frequency-dividing circuit for dividing the clock that is supplied as output by said voltage-controlled oscillation circuit to generate a feedback clock and supplying the feedback clock as output to said phase/frequency detection circuit;
   wherein:
   said PLL circuit is further provided with a correction voltage generation circuit for generating and supplying as output a correction voltage for correcting said PLL control voltage;
   said charge pump bias circuit receives the correction voltage that is supplied as output by said correction voltage generation circuit to regulate the discharging current and generate and supply as output a second discharging current bias voltage;
   said PLL circuit is further provided with:
   a first capacitor that is provided between said charge pump circuit and said voltage-controlled oscillation circuit; and
   a replica charge pump circuit provided with a second capacitor in which charging/discharging is carried out in accordance with output; said replica charge pump circuit supplying charging current to said second capacitor during the time interval in which both said first charging current bias voltage is received as input and the complementary signal of said phase/frequency amplification signal is low level, and during the time interval in which both said second discharging current bias voltage is received as input and said phase/frequency amplification signal is high level, supplying discharging current to said second capacitor, and generating a reference voltage in which these currents are combined, and supplying this reference voltage as output to said correction voltage generation circuit;

said charge pump circuit:
supplies charging current to said first capacitor during the time interval in which both said first charging current bias voltage is received as input and the complementary signal of said phase/frequency amplification signal is low level; and during the time interval in which both said second discharging current bias voltage is received as input and said phase/frequency attenuation signal is high level, supplies discharging current to said first capacitor, generates a PLL control voltage in which these currents are combined, and supplies this PLL control voltage as output to said voltage-controlled oscillation circuit and said correction voltage generation circuit; and said correction voltage generation circuit:
compares said PLL control voltage and said reference voltage, generates a differential voltage as correction voltage, and supplies the correction voltage as output to said charge pump bias circuit.

2. A PLL circuit comprising:
a phase/frequency detection circuit for detecting a phase difference and frequency difference between a reference clock that is received as input from an outside and a clock that is generated by the PLL circuit, and for generating and supplying as output a phase/frequency amplification signal and a phase/frequency attenuation signal having a pulse widths that accord with the phase difference and frequency difference as well as complementary signals of these signals;
a charge pump bias circuit for receiving a reference bias voltage as input and generating and supplying as output a first charging current bias voltage and a first discharging current bias voltage;
a charge pump circuit for supplying charging current in accordance with said first charging current bias voltage, supplying discharging current in accordance with said first discharging current bias voltage, and generating and supplying as output a PLL control voltage;
a voltage-controlled oscillation circuit for receiving said PLL control voltage and generating a clock; and
a frequency-dividing circuit for dividing the clock that is supplied as output by said voltage-controlled oscillation circuit to generate a feedback clock and supplying the feedback clock to said phase/frequency detection circuit;
wherein:
said PLL circuit is further provided with a correction voltage generation circuit for generating and supplying as output a correction voltage for correcting said PLL control voltage;
said charge pump bias circuit receives the correction voltage that is supplied as output by said correction voltage generation circuit to regulate charging current and generate and supply as output a second charging current bias voltage;
said PLL circuit is further provided with:
a first capacitor that is provided between said charge pump circuit and said voltage-controlled oscillation circuit; and
a replica charge pump circuit that is provided with a second capacitor in which charging/discharging is carried out in accordance with output, said replica charge pump circuit supplying charging current to said second capacitor during the time interval in which both said second charging current bias voltage is received as input and the complementary signal of said phase/frequency amplification signal is low level, and during the time interval in which both said first discharging current bias voltage is received as input and said phase/frequency amplification signal is high level, supplying discharging current to said second capacitor, generating a reference voltage in which these currents are combined, and supplying this reference voltage as output to said correction voltage generation circuit;

said charge pump circuit:
supplies charging current to said first capacitor during the time interval in which both said second charging current bias voltage is received as input and the complementary signal of said phase/frequency amplification signal is low level, and during the time interval in which both said first discharging current bias voltage is received as input and said phase/frequency attenuation signal is high level, supplies discharging current to said first capacitor, generates a PLL control voltage in which these currents are combined, and supplies this PLL control voltage to said voltage-controlled oscillation circuit and said correction voltage generation circuit; and said correction voltage generation circuit:
compares said PLL control voltage and said reference voltage, generates a differential voltage as a correction voltage, and supplies the correction voltage as output to said charge pump bias circuit.

3. A PLL circuit comprising:
a phase/frequency detection circuit for detecting a phase difference and frequency difference between a reference clock that is received as input from an outside and a clock that is generated by the PLL circuit, and for generating and supplying as output a phase/frequency amplification signal and a phase/frequency attenuation signal having pulse widths that accord with the phase difference and frequency difference as well as complementary signals of these signals;
a charge pump bias circuit for receiving a reference bias voltage as input and generating and supplying as output a first charging current bias voltage and a first discharging current bias voltage;
a charge pump circuit for supplying charging current in accordance with said first charging current bias voltage, supplying discharging current in accordance with said first discharging current bias voltage, and generating and supplying as output a PLL control voltage;
a voltage-controlled oscillation circuit for receiving said PLL control voltage as input and generating a clock; and
a frequency-dividing circuit for dividing the clock that is supplied as output by said voltage-controlled oscillation circuit to generate a feedback clock and supplying the feedback clock as output to said phase/frequency detection circuit;
wherein:
said PLL circuit is further provided with: a correction voltage generation circuit for generating and supplying as output a correction voltage for correcting said PLL control voltage;
said charge pump bias circuit:
receives the correction voltage that is supplied as output by said correction voltage generation circuit to regulate the charging current and generate and supply as output a second charging current bias voltage; and
receives as input the correction voltage that is the complement of the correction voltage that is supplied as output by said correction voltage generation circuit to regulate the discharging current and generate and supply as output a second discharging current bias voltage;

said PLL circuit is further provided with:

a first capacitor that is provided between said charge pump circuit and said voltage-controlled oscillation circuit; and a replica charge pump circuit that is provided with a second capacitor in which charging/discharging is carried out in accordance with output, said replica charge pump circuit supplying charging current to said second capacitor during the time interval in which both said second charging current bias voltage is received as input and the complementary signal of said phase/frequency amplification signal is low level, and during the time interval in which both said second discharging current bias voltage is received as input and said phase/frequency amplification signal is high level, supplying discharging current to said second capacitor, generating a reference voltage in which these currents are combined, and supplying this reference voltage as output to said correction voltage generation circuit;

said charge pump circuit:

supplies charging current to said first capacitor during the time interval in which both said second charging current bias voltage is received as input and the complementary signal of said phase/frequency amplification signal is low level; and during the time interval in which both said second discharging current bias voltage is received as input and said phase/frequency attenuation signal is high level, supplies discharging current to said first capacitor, generates a PLL control voltage in which these currents are combined, and supplies this PLL control voltage as output to said voltage-controlled oscillation circuit and said correction voltage generation circuit; and said correction voltage generation circuit:

compares said PLL control voltage and said reference voltage, generates the differential voltage as correction voltage, and supplies the correction voltage and a correction voltage that is the complement of this voltage as output to said charge pump bias circuit.

4. A PLL circuit comprising:

a phase/frequency detection circuit for detecting a phase difference and frequency difference between a reference clock that is received as input from an outside and a clock that is generated by the PLL circuit, and for generating and supplying as output a phase/frequency amplification signal and a phase/frequency attenuation signal having pulse widths that accord with the phase difference and frequency difference as well as complementary signals of these signals;

a charge pump bias circuit for receiving a reference bias voltage as input and generating and supplying as output a first charging current bias voltage and a first discharging current bias voltage;

a charge pump circuit for supplying charging current in accordance with said first charging current bias voltage, supplying discharging current in accordance with said first discharging current bias voltage, and generating and supplying as output a PLL control voltage;

a voltage-controlled oscillation circuit for receiving said PLL control voltage and generating a clock; and a frequency-dividing circuit for dividing the clock that is supplied as output by said voltage-controlled oscillation circuit to generate a feedback clock and supplying the feedback clock as output to said phase/frequency detection circuit;

wherein:

said PLL circuit is further provided with:

a correction voltage generation circuit for generating and supplying as output a correction voltage for correcting said PLL control voltage;

a first capacitor that is provided between said charge pump circuit and said voltage-controlled oscillation circuit; and a replica charge pump circuit that is provided with a second capacitor in which charging/discharging is carried out in accordance with output, said replica charge pump circuit, during the time interval in which both said first charging current bias voltage is received as input and the complementary signal of said phase/frequency amplification signal is low level, supplying charging current to said second capacitor, receiving the correction voltage that is supplied as output by said correction voltage generation circuit to regulate the discharging current and generate the second discharging current bias voltage; and during the time interval in which both said second discharging current bias voltage is generated and said phase/frequency amplification signal is high level, supplying discharging current to said second capacitor, generating a reference voltage in which these currents are combined, and supplying this reference voltage to said correction voltage generation circuit;

said charge pump circuit:

during the time interval in which both said first charging current bias voltage is received as input and the complementary signal of said phase/frequency amplification signal is low level, supplies charging current to said first capacitor, receives the correction voltage that is supplied as output by said correction voltage generation circuit to regulate the discharging current and generate a second discharging current bias voltage; and during the time interval in which both said second discharging current bias voltage is generated and said phase/frequency attenuation signal is high level, supplies discharging current to said first capacitor, generates a PLL control voltage in which these currents are combined, and supplies this PLL control voltage as output to said voltage-controlled oscillation circuit and said correction voltage generation circuit; and said correction voltage generation circuit:

compares said PLL control voltage and said reference voltage, generates the differential voltage as the correction voltage, and supplies the correction voltage as output to said charge pump circuit and said replica charge pump circuit.

5. A PLL circuit comprising:

a phase/frequency detection circuit for detecting a phase difference and frequency difference between a reference clock that is received as input from an outside and a clock that is generated by the PLL circuit, and for generating and supplying as output a phase/frequency amplification signal and a phase/frequency attenuation signal having pulse widths that accord with the phase difference and frequency difference as well as complementary signals of these signals;

a charge pump bias circuit for receiving a reference bias voltage as input and generating and supplying as output a first charging current bias voltage and a first discharging current bias voltage;

a charge pump circuit for supplying charging current in accordance with said first charging current bias voltage, supplying discharging current in accordance with said first discharging current bias voltage, and generating and supplying as output a PLL control voltage;

a voltage-controlled oscillation circuit for receiving said PLL control voltage and generating a clock; and a frequency-dividing circuit for dividing the clock that is supplied as output by said voltage-controlled oscillation circuit to generate a feedback clock and supplying the feedback clock as output to said phase/frequency detection circuit;

wherein:

said PLL circuit is further provided with:

a correction voltage generation circuit for generating and supplying as output a correction voltage for correcting said PLL control voltage;

a first capacitor that is provided between said charge pump circuit and said voltage-controlled oscillation circuit; and a replica charge pump circuit that is provided with a second capacitor in which charging/discharging is carried out in accordance with output, said replica charge pump circuit receiving the correction voltage that is supplied as output by said correction voltage generation circuit to regulate the charging current and generate a second charging current bias voltage; during the time interval in which both said second charging current bias voltage is generated and the complementary signal of said phase/frequency amplification signal is low level, supplying charging current to said second capacitor; and during the time interval in which both said first discharging current bias voltage is received as input and said phase/frequency amplification signal is high level, supplying discharging current to said second capacitor, generating a reference voltage in which these currents are combined, and supplying this reference voltage to said correction voltage generation circuit;

said charge pump circuit:

receives the correction voltage that is supplied as output by said correction voltage generation circuit to regulate the charging current and generate a second charging current bias voltage; during the time interval in which both said second charging current bias voltage is generated and the complementary signal of said phase/frequency amplification signal is low level, supplies charging current to said first capacitor; and during the time interval in which both said first discharging current bias voltage is received as input and said phase/frequency attenuation signal is high level, supplies discharging current to said first capacitor, generates a PLL control voltage in which these currents are combined, and supplies this PLL control voltage as output to said voltage-controlled oscillation circuit and said correction voltage generation circuit; and said correction voltage generation circuit:

compares said PLL control voltage and said reference voltage, generates the differential voltage as correction voltage, and supplies the correction voltage as output to said charge pump circuit and said replica charge pump circuit.

6. A PLL circuit comprising:

a phase/frequency detection circuit for detecting a phase difference and frequency difference between a reference clock that is received as input from an outside and a clock that is generated by said PLL circuit, and for generating and supplying as output a phase/frequency amplification signal and a phase/frequency attenuation signal having pulse widths that accord with said phase difference and frequency difference as well as complementary signals of these signals;

a charge pump bias circuit for receiving a reference bias voltage as input and generating and supplying as output a first charging current bias voltage and a first discharging current bias voltage;

a charge pump circuit for supplying charging current in accordance with said first charging current bias voltage, supplying discharging current in accordance with said first discharging current bias voltage, and generating and supplying as output a PLL control voltage;

a voltage-controlled oscillation circuit for receiving said PLL control voltage and generating a clock; and a frequency-dividing circuit for dividing the clock that is supplied as output by said voltage-controlled oscillation circuit to generate a feedback clock and supplying the feedback clock as output to said phase/frequency detection circuit;

wherein:

said PLL circuit is further provided with:

a correction voltage generation circuit for generating and supplying as output a correction voltage for correcting said PLL control voltage;

a first capacitor that is provided between said charge pump circuit and said voltage-controlled oscillation circuit; and a replica charge pump circuit that is provided with a second capacitor in which charging/discharging is carried out in accordance with output, said replica charge pump circuit receiving the correction voltage that is supplied as output by said correction voltage generation circuit to regulate the discharging current and generate a second discharging current bias voltage; during the time interval in which both said second discharging current bias voltage is generated and said phase/frequency amplification signal is high level, supplying discharging current to said second capacitor; and during the time interval in which both a correction voltage that is the complement of the correction voltage that is supplied as output by said correction voltage generation circuit is received as input to regulate the charging current and generate a second charging current bias voltage and the complementary signal of said phase/frequency amplification signal is low level, supplying charging current to said second capacitor, generating a reference voltage in which these currents are combined, and supplying this reference voltage as output to said correction voltage generation circuit;

said charge pump circuit:

receives the correction voltage that is supplied as output by said correction voltage generation circuit to regulate the discharging current and generate a second discharging current bias voltage; during the time interval in which both said second discharging current bias voltage is generated and said phase/frequency attenuation signal is high level, supplies discharging current to said first capacitor; and during the time interval in which both a correction voltage that is the complement of the correction voltage that is supplied as output by said correction voltage generation circuit is received to regulate the charging current and generate a second charging current bias voltage and the complementary signal of said phase/frequency amplification signal is low level, supplies charging current to said first capacitor, generates a PLL control voltage in which these currents are combined, and supplies this PLL control voltage as output to said voltage-controlled oscillation circuit and said correction voltage generation circuit; and said correction voltage generation circuit:

compares said PLL control voltage and said reference voltage, generates the differential voltage as the correction voltage, and supplies the correction voltage and the correction voltage that is the complement of this correction voltage to said charge pump circuit and said replica charge pump circuit.

* * * * *